(12) United States Patent
Linn et al.

(10) Patent No.: US 11,701,880 B2
(45) Date of Patent: Jul. 18, 2023

(54) DIE FOR A PRINTHEAD

(71) Applicant: Hewlett-Packard Development Company, L.P., Spring, TX (US)

(72) Inventors: Scott A. Linn, Corvallis, OR (US); James Michael Gardner, Corvallis, OR (US); Michael W. Cumbie, Albany, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/766,519

(22) PCT Filed: Feb. 6, 2019

(86) PCT No.: PCT/US2019/016786
§ 371 (c)(1),
(2) Date: May 22, 2020

(87) PCT Pub. No.: WO2020/162913
PCT Pub. Date: Aug. 13, 2020

(65) Prior Publication Data
US 2021/0354455 A1   Nov. 18, 2021

(51) Int. Cl.
*B41J 2/045* (2006.01)
*B41J 2/14* (2006.01)
*G11C 7/10* (2006.01)

(52) U.S. Cl.
CPC ......... *B41J 2/04551* (2013.01); *B41J 2/0458* (2013.01); *B41J 2/04541* (2013.01); *B41J 2/04543* (2013.01); *B41J 2/04581* (2013.01); *B41J 2/1433* (2013.01); *B41J 2/14072* (2013.01); *B41J 2/14201* (2013.01); *G11C 7/1072* (2013.01); *B41J 2002/14491* (2013.01)

(58) Field of Classification Search
CPC .................................................. B41J 2/14112
See application file for complete search history.

(56) References Cited

U.S. PATENT DOCUMENTS

| 5,103,246 | A | * | 4/1992 | Dunn | B41J 2/1404 |
| | | | | | 347/58 |
| 5,859,796 | A | | 1/1999 | Cleveland | |
| 6,065,823 | A | * | 5/2000 | Kawamura | B41J 2/14129 |
| | | | | | 347/17 |
| 6,390,580 | B1 | * | 5/2002 | Anderson | B41J 2/04586 |
| | | | | | 347/12 |
| 6,478,396 | B1 | | 11/2002 | Schloeman et al. | |

(Continued)

FOREIGN PATENT DOCUMENTS

| CN | 1922019 A | 2/2007 |
| CN | 101522428 A | 9/2009 |

(Continued)

*Primary Examiner* — Shelby L Fidler
(74) *Attorney, Agent, or Firm* — Foley & Lardner LLP

(57) ABSTRACT

A die for a printhead is provided in examples. The die includes a number of fluidic actuator arrays. A data block is associated with each of the plurality of fluidic actuator arrays. The die includes an interface comprising a data pad and a clock pad, wherein a data bit value present at the data pad is loaded into a first data block corresponding to a first fluidic actuator array on a rising clock edge and loaded into a second data block corresponding to a second fluidic actuator array on a falling clock edge.

9 Claims, 26 Drawing Sheets

(56) References Cited

U.S. PATENT DOCUMENTS

| | | |
|---|---|---|
| 6,582,062 B1 | 6/2003 | Childers et al. |
| 6,712,451 B2 | 3/2004 | Madziarz et al. |
| 8,123,318 B2 | 2/2012 | Walmsley et al. |
| 8,864,260 B1 | 10/2014 | Ge et al. |
| 11,453,212 B2* | 9/2022 | Ng ............................ G11C 7/16 |
| 2002/0149632 A1* | 10/2002 | Parish ................... B41J 2/1601 347/5 |
| 2003/0081028 A1 | 5/2003 | Feinn et al. |
| 2003/0184618 A1* | 10/2003 | Childers ................ B41J 2/0458 347/59 |
| 2004/0257402 A1 | 12/2004 | Lynch et al. |
| 2007/0076032 A1* | 4/2007 | Bergstedt ............ B41J 2/04543 347/12 |
| 2007/0268336 A1* | 11/2007 | Lee ...................... B41J 2/14072 347/56 |
| 2008/0143786 A1 | 6/2008 | Oikawa et al. |
| 2009/0315945 A1* | 12/2009 | Oikawa ................ B41J 2/14112 347/44 |
| 2014/0320558 A1* | 10/2014 | Ge ....................... B41J 2/04521 347/9 |
| 2015/0210072 A1* | 7/2015 | Sumiyoshi ............. B41J 2/0458 347/10 |
| 2018/0050537 A1* | 2/2018 | Bakker ................ B41J 2/04541 |

FOREIGN PATENT DOCUMENTS

| | | |
|---|---|---|
| CN | 108883635 A | 11/2018 |
| EP | 2188130 B1 | 1/2015 |
| JP | 2002-067322 A | 3/2002 |
| JP | 2008-119895 A | 5/2008 |
| JP | 2018-505077 A | 2/2018 |
| TW | I319355 | 1/2010 |
| TW | I644805 | 12/2018 |
| WO | WO-2016130157 A1 | 8/2016 |

\* cited by examiner

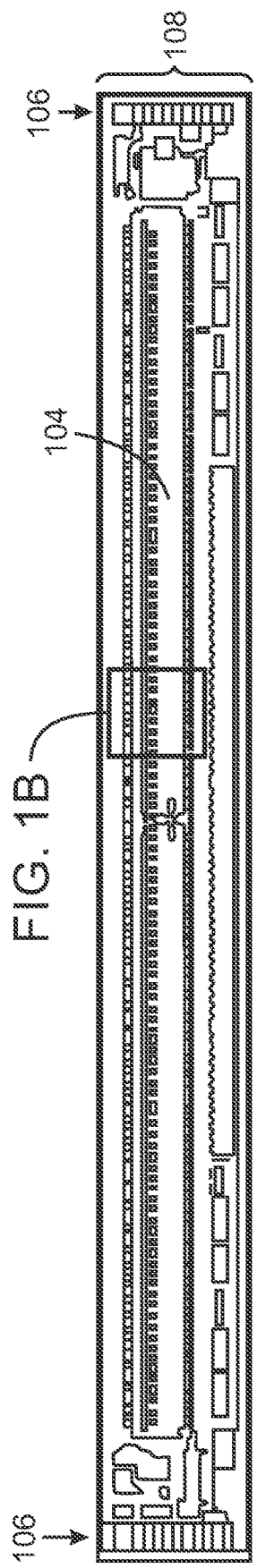
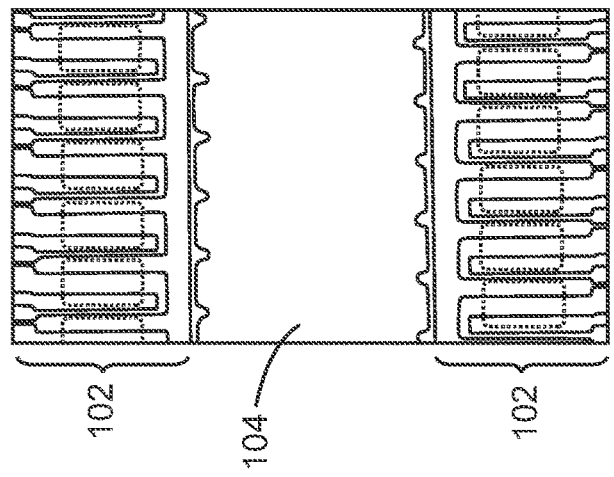
FIG. 1A (Prior Art)
FIG. 1B (Prior Art)

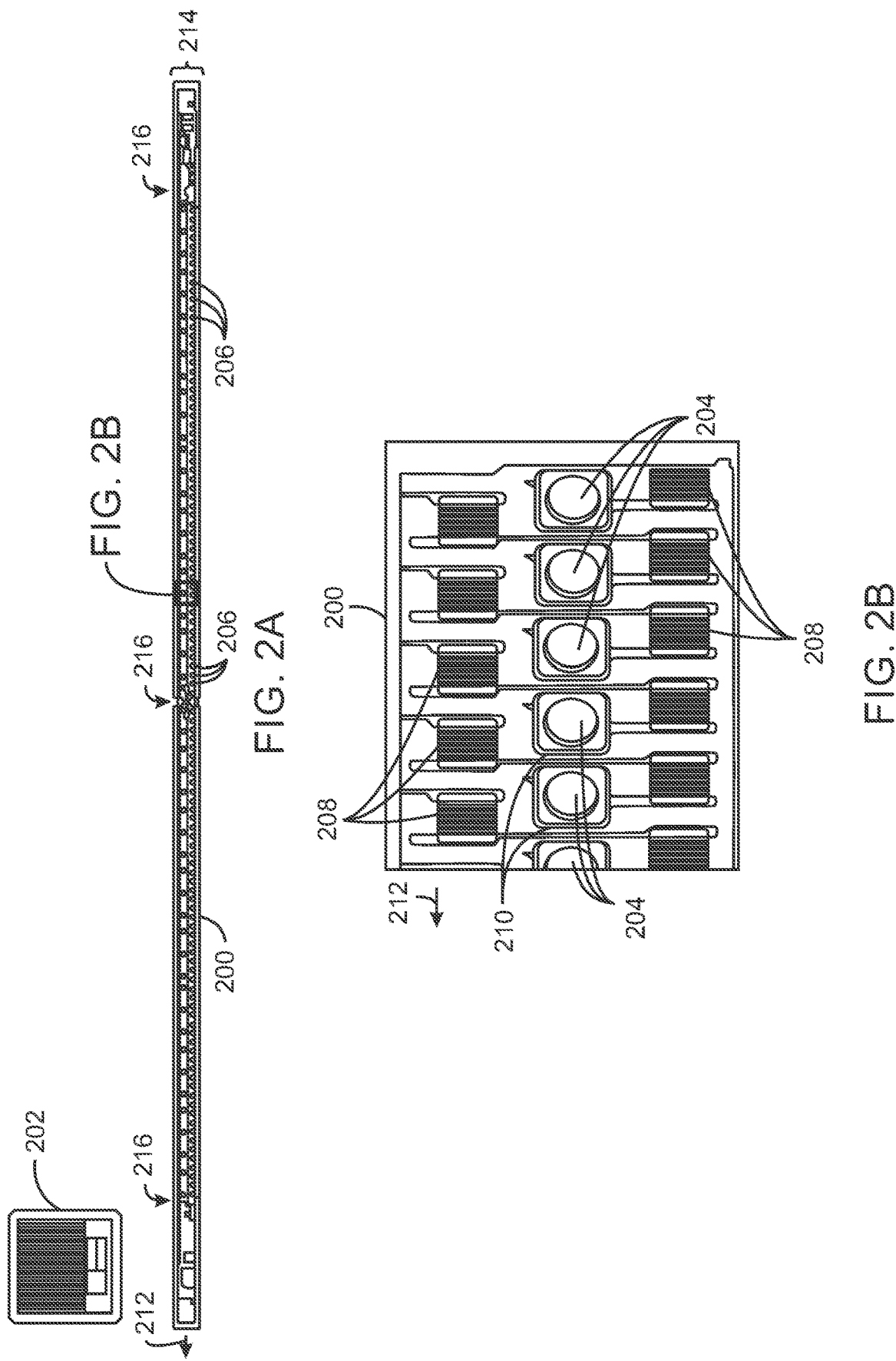

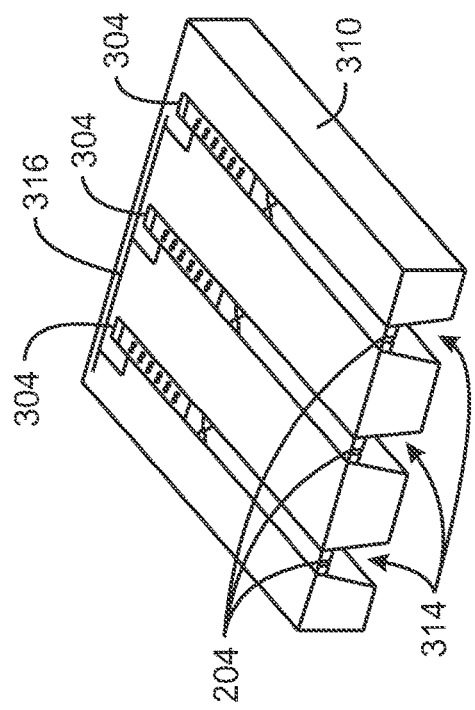
FIG. 3B
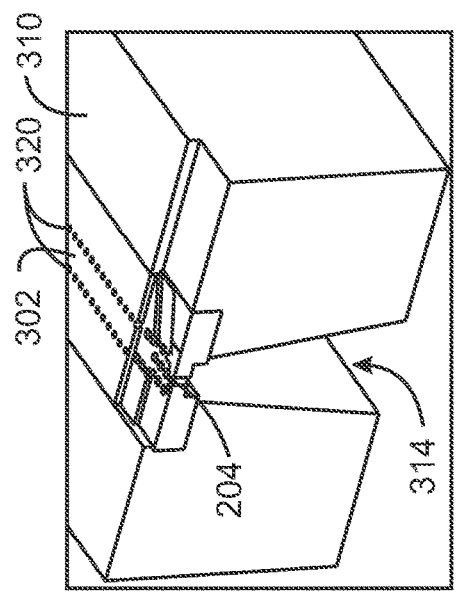
FIG. 3A
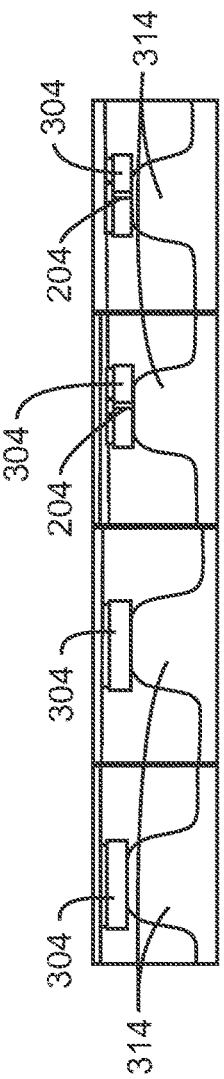
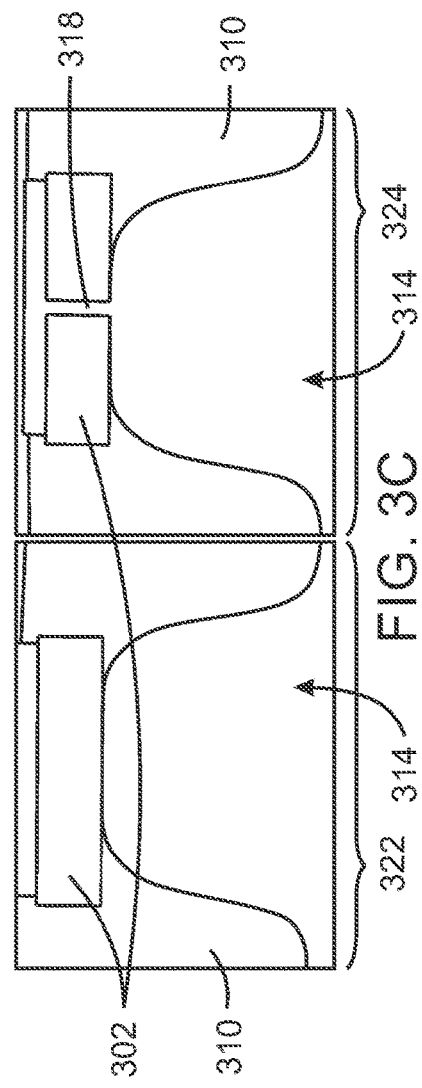
FIG. 3C

302

DIE FOR A PRINTHEAD

CROSS-REFERENCE TO RELATED APPLICATION

Pursuant to 35 U.S.C. § 371, this application is a United States National Stage Application of PCT Patent Application Serial No. PCT/US2019/016786, filed on Feb. 6, 2019, the contents of which are incorporated by reference as if set forth in their entirety herein.

BACKGROUND

A printing system, as one example of a fluid ejection system, may include a printhead, an ink supply which supplies liquid ink to the printhead, and an electronic controller which controls the printhead. The printhead ejects drops of print fluid through a plurality of fluidic actuators or orifices onto a print medium. The printheads may include thermal or piezo printheads that are fabricated on integrated circuit wafers or dies. Drive electronics and control features are first fabricated, then the columns of heater resistors are added and finally the structural layers, for example, formed from photo-imagable epoxy, are added, and processed to form microfluidic ejectors, or drop generators. In some examples, the microfluidic ejectors are arranged in at least one column or array such that properly sequenced ejection of ink from the orifices causes characters or other images to be printed upon the print medium as the printhead and the print medium are moved relative to each other. Other fluid ejection systems include three-dimensional print systems or other high precision fluid dispensing systems for example for life science, laboratory, forensic or pharmaceutical applications. Suitable fluids may include inks, print agents or any other fluid used by these fluid ejection systems.

BRIEF DESCRIPTION OF THE DRAWINGS

Certain examples are described in the following detailed description and in reference to the drawings, in which:

FIG. 1A is a view of a part of a die used for a prior art inkjet printhead;

FIG. 1B is an enlarged view of a portion of the die;

FIG. 2A is a view of an example of a die used for a printhead;

FIG. 2B is an enlarged view of a portion of the die;

FIG. 3A is a drawing of an example of a printhead including a black die that is mounted in a potting compound;

FIG. 3B is a drawing of an example of a printhead including three dies, which may be used for three colors of ink;

FIG. 3C shows cross-sectional views of the printheads including the mounted dies through solid sections and through sections having fluid feed holes;

DETAILED DESCRIPTION OF SPECIFIC EXAMPLES

Figure 4:
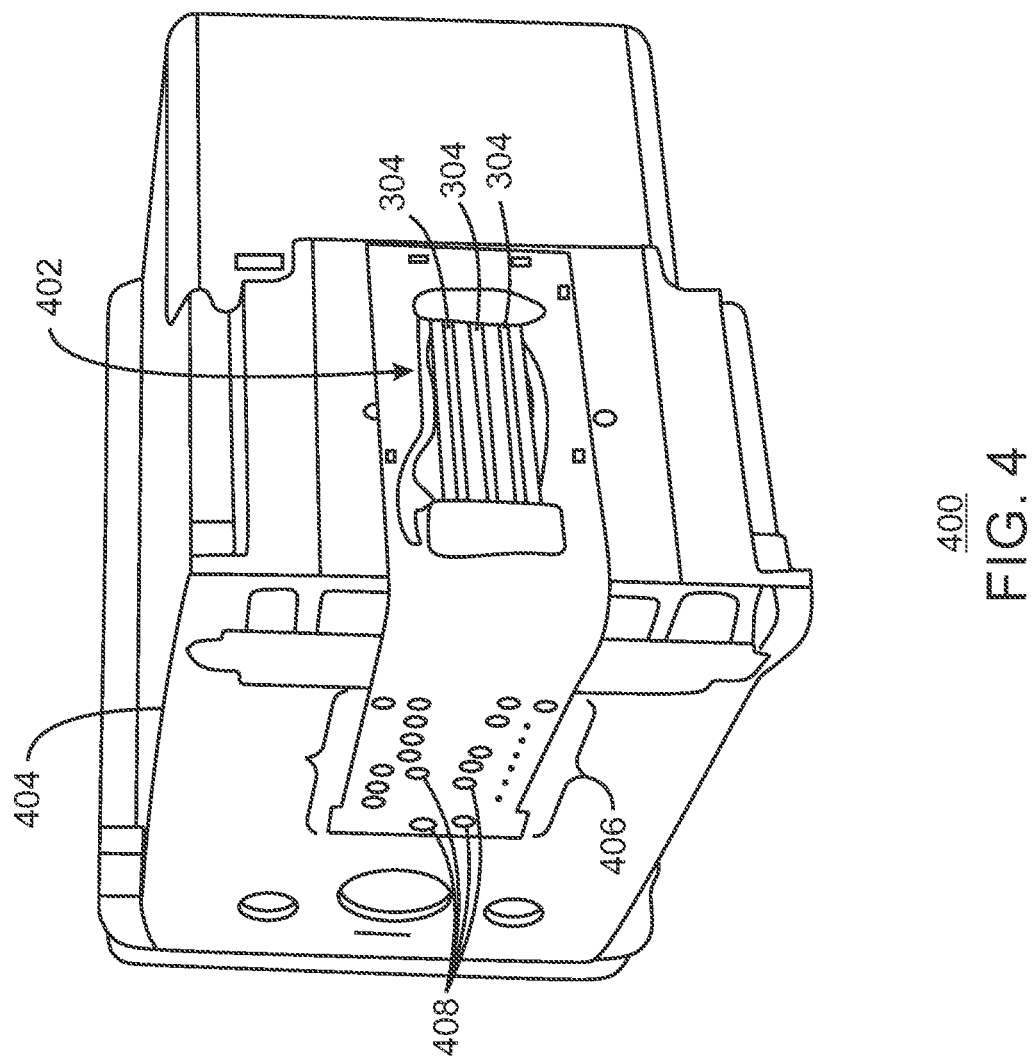
FIG. 4 is an example of a printer cartridge that incorporates the printhead described with respect to FIG. 3B.

Printheads are formed using fluidic actuators, such as microfluidic ejectors and microfluidic pumps. The fluidic actuators can be based on thermal resistors or piezoelectric technologies, which may force the ejection of a droplet from a nozzle or force a small amount of fluid to move out of a pumping chamber. The fluidic actuators are formed using long, narrow pieces of silicon, termed dies or print components herein. In examples described herein, a microfluidic ejector is used as an ejector for a nozzle in a die, used for printing and other applications. For example, printheads can be used as fluid ejection devices in two-dimensional and three-dimensional printing applications and other high precision fluid dispensing systems including pharmaceutical, laboratory, medical, life science and forensic applications. While this disclosure may refer to inkjet and ink applications, the principles disclosed herein are to be associated with any fluid propelling or fluid ejecting application, not limited to ink.

The cost of printheads is often determined by the amount of silicon used in the dies, as the cost of the die and the fabrication process increase with the total amount of silicon used in a die. Accordingly, lower cost printheads may be formed by moving functionality off the die to other integrated circuits, allowing for smaller dies.

Many current dies have an ink feed slot in the middle of the die to bring ink to the fluidic actuators. The ink feed slot generally provides a barrier to carrying signals from one side of an die to another side of a die, which often requires duplicating circuitry on each side of the die, further increasing the size of the die. In this arrangement, fluidic actuators on one side of the slot, which may be termed left or west, have independent addressing and power bus circuits from fluidic actuators on the opposite side of the ink feed slot, which may be termed right or east.

Examples described herein provide a new approach to providing fluid to the fluidic actuators of the drop ejectors. In this approach, the ink feed slot is replaced with an array of fluid feed holes disposed along the die, proximate to the fluidic actuators. The array of fluid feed holes disposed along the die may be termed a feed zone, herein. As a result, signals can be routed through the feed zone, between the fluid feed holes, for example, from the logic circuitry located on one side of the fluid feed holes to printing power circuits, such as field-effect transistors (FETs), located on the opposite side of the fluid feed holes. This is termed cross-slot routing herein. The circuitry to route the signals includes traces provided in layers between adjacent ink or fluid feed holes.

As used herein, a first side of the die and a second side of the die denote the long edges of the die that are in alignment with the fluid feed holes, which are placed near or at the center of the die. Further, as used herein, the fluidic actuators are located on a front face of the die, and the ink or fluid is fed to the fluid feed holes from a slot on the back face of the die. Accordingly, the width of the die is measured from the edge of the first side of the die to the edge of the second side of the die. Similarly, the thickness of the die is measured from the front face of the die to the back face of the die.

The cross-slot routing allows for the elimination of duplicate circuitry on the die, which can decrease the width of the die, for example, by 150 micrometers (μm) or more. In some examples, this may provide a die with a width of about 450 μm or about 360 μm, or less. In some examples, the elimination of duplicate circuitry by the cross-slot routing may be used to increase the size of the circuitry on the die, for example, to enhance performance in higher value applications. In these examples, the power FETs, the circuit traces, power traces, and the like, may be increased in size. This may provide dies that are capable of higher droplet weights. Accordingly, in some examples, the dies may be less than about 500 μm, or less than about 750 μm, or less than about 1000 μm in width.

The thickness of the die from the front face to the back face is also decreased by the efficiencies gained from the use of the fluid feed holes. Previous dies that use ink feed slots may be greater than about 675 μm, while dies using the fluid feed holes may be less than about 400 μm in thickness. The length of the dies may be about 10 millimeters (mm), about 20 mm, or about 20 mm, depending on the number of fluidic actuators used for the design. The length of the dies includes space at each end of the die for circuitry, accordingly the fluidic actuators occupy a portion of the length of the die. For example, for a black die of about 20 mm in length, the fluidic actuators may occupy about 13 mm, which is the swath length. A swath length is the width of the band of printing, or fluid ejection, formed as a printhead is moved across a print medium.

Further, the cross-slot routing allows the co-location of similar devices for increased efficiency and layout. The cross-slot routing optimizes power delivery by allowing left and right columns of fluidic actuators, to share power and ground routing circuits. However, a narrower die may be more fragile than a wider die. Accordingly, the die may be mounted in a polymeric potting compound that has a slot from a reverse side to allow ink to flow to the fluid feed holes. In some examples, the potting compound is an epoxy, although it may be an acrylic, a polycarbonate, a polyphenylene sulfide, and the like.

The cross-slot routing also allows for the optimization of circuit layout. For example, the high-voltage and low-voltage domains may be isolated on opposite sides of the fluid feed holes allowing for improvements in reliability and form factor for the dies. The separation of the high-voltage and low-voltage domains may decrease or eliminate parasitic voltages, crosstalk, and other issues that affect the reliability of the die. Further, a single instance of address data is conveyed to logic blocks which decode the address value uniquely for each side of an array of fluid feed holes.

To meet fluidic constraints and minimize effects of fluid flow to multiple fluidic actuators, such as fluidic cross-talk that can affect image quality, the address decode is offset for fluidic actuators on each respective side of the array of fluid feed holes. The address decoding may be customized for each group of fluidic actuators, or primitives, during fabrication of the die, for example, as a final step during the fabrication process. Other customizations may be used to determine which fluidic actuators are to fire from the values on the address lines.

The die used for a printhead, as described herein, uses resistors to heat fluids in a microfluidic ejector causing droplet ejection by thermal expansion. However, the dies are not limited to thermally driven fluidic actuators and may use piezoelectric fluidic actuators that are fed from fluid feed holes.

Further, the die may be used to form fluidic actuators for other applications besides a printhead, such as microfluidic pumps, used in analytical instrumentation. In this example, the fluidic actuators may be fed test solutions, or other fluids, rather than ink, from fluid feed holes. Accordingly, in various examples, the fluid feed holes and inks can be used to provide fluidic materials that may be ejected or pumped by droplet ejection from thermal expansion or piezoelectric activation.

In addition to the efficiencies gained by the cross routing of the signals from one side to the other, the dies described herein move logic circuits from the die to an external chip, or other support circuit. In various examples, the external chip is an application specific integrated circuit (ASIC) that is integrated into the printer. Further, individual colors are separated onto single dies versus incorporating multiple colors on a single die, which enables lower cost fluid manifolds for delivering ink and other fluids to the dies. Moving the thermal control loop off chip also enables much more complex thermal system behavior, while not increasing costs, such as the ability to take and average multiple measurements, use relative setpoints, enable higher thermal resolution sensing, and increasing the number of sensors or sense zones on the individual dies and colors, among others. Associating the memory bits with decoding logic for addressing fluidic actuators enables the creation of large memory arrays at a low overhead cost.

In some examples, the memory bits are read using a sensor bus that is also used for external analog measurements, such as the thermal measurements, to further lower the cost. As the sensor bus is shared between various sensors, such as thermal sensors, crack detection sensors, and the memory bits, on-die, high-voltage protection circuitry prevents damage to low-voltage devices connected to the sense bus during a memory write. In some examples, an on-die voltage generator, or memory voltage regulator, is used to write memory bits without the need for an additional electrical interface from external circuitry.

FIG. 1A is a view of a part of a die 100 used for a prior art inkjet printhead. The die 100 includes all circuitry to operate fluidic actuators 102 on both sides of an ink feed slot 104. Accordingly, all electrical connections are brought out on pads 106 located at each end of the die 100. FIG. 1B is an enlarged view of a portion of the die 100. As can be seen in this enlarged view, the ink feed slot 104 occupies a substantial amount of space in the center of the die 100, increasing the width 108 of the die 100.

FIG. 2A is a view of an example of a die 200 used for a printhead. In comparison with the die 100 of FIG. 1A, has an efficient and novel circuit lay-out wherein individual circuit blocks may have more functions, allowing the die 200 to be relatively narrow and/or efficient, as described herein. In this design, some functionality is provided to the die by an external circuit, such as an application specific integrated circuit (ASIC) 200.

In this example, the die 200 uses fluid feed holes 204 to provide fluid, such as inks, to the fluidic actuators 206 for ejection by thermal resistors 208. As described herein, the cross-slot routing allows circuitry to be routed along silicon bridges 210 between the fluid feed holes 204 and across the longitudinal axis 212 of the die 200. In one example, this also allows the width 214 of the die 200 to be relatively small, for example, being less than about 420 µm, less than about 500 µm, or less than about 750 µm, or less than about 1000 µm, for example between about 330 µm and about 460 µm. The narrow width of the die 200 may decrease costs, for example, by lowering the amount of silicon used in the die 200.

As described herein, the die 200 also includes sensor circuitry for operations and diagnostics. In some examples, the die 200 includes thermal sensors 216, for example, placed along the longitudinal axis of the die near one end of the die, at the middle of the die, and near the opposite end of the die. In some examples, more thermal sensors 216 are used to improve thermal control.

FIGS. 3A to 3C are drawings of printheads formed by mounting of dies 302 and 304 in a polymeric mount 310 formed from a potting compound. In some examples, the dies 302 and 304 are too narrow to directly attach to pen bodies or fluidically route ink, or other fluids, from fluid reservoirs. Accordingly, the dies 302 and 304 may be mounted in a polymeric mount 310 formed from a potting compound, such as an epoxy material, among others. The polymeric mount 310 has slots 314 which provide an open region to allow fluid to flow from the fluid reservoir to the fluid feed holes 204 on the back face the dies 302 and 304.

FIG. 3A is a drawing of an example of a printhead including a black die 302 that is mounted in a potting compound. In the black die 302 of FIG. 3A, two lines of fluidic actuators 320 are visible, wherein each group of two alternating fluidic actuators 320 are fed from one of the fluid feed holes 204 along the black die 302. Each of the fluidic actuators 320 is an opening to a fluid chamber above a thermal resistor. Actuation of the thermal resistor forces fluid out through the fluidic actuators 320, thus, each combination of thermal resistor fluid chamber and nozzle represents a fluidic actuator, specifically, a microfluidic ejector. It may be noted that the fluid feed holes 204 are not isolated from each other, allowing ink to flow from fluid feed holes 204 to nearby fluid feed holes 204, providing a higher flow rate for the active fluidic actuators.

FIG. 3B is a drawing of an example of a printhead including three dies 304, which may be used for three colors of ink. For example, one color die 304 may be used for a cyan ink, another color die 304 may be used for a magenta ink, and a last color die 304 may be used for a yellow ink. Each of the inks are fed into the associated slot 314 of the color dies 304 from a separate color ink reservoir. Although this drawing shows only three of the color dies 304 in the mount, a fourth die, such as a black die 302, may be included to form a CMYK die. Similarly, other die configurations may be used. Communication lines 316 may be embedded in the in a polymeric mount 310 to interface with the color dies 304. As described herein, some of the communication line 316, such as address lines, a sensor bus, and a firing line, among others, may be shared amongst the color dies 304. The communication lines 316 also include individual data lines to provide individual control signals for the activation of fluidic actuator arrays, or primitives.

FIG. 3C shows cross-sectional views of the printheads including the mounted dies 302 and 304 through solid sections 322 and through sections 324 having fluid feed holes 204. This shows that the fluid feed holes 204 coupled to the slots 314 to allow ink to flow from the slots 314 through the mounted dies 302 and 304. As described herein, the structures in FIGS. 3A to 3C are not limited to inks, but may be used to provide a fluid feed system to fluidic actuators in dies.

FIG. 4 is an example of a printer cartridge 400 that incorporates the printhead described with respect to FIG. 3B. The mounted color dies 304 form a pad 402. As described herein the pad 402 includes the multiple silicon dies, and the polymeric mounting compound, such as an epoxy potting compound. The housing 404 holds the ink reservoirs used to feed the mounted color dies 304 in the pad 402. A flex connection 406, such as a flexible circuit, holds the printer contacts, or pads, 408 used to interface with the printer cartridge 400. The circuit design described herein allows for fewer pads 408 to be used in the printer cartridge 400 versus previous printer cartridges. For example, the use of the shared sensor bus that is multiplexed between all of the color dies 304 present in the printer cartridge 400 allows a single pad 408 to be used for one or more sense functions, including thermal sensing, crack detection, and also for memory reads. Further, single pads are shared between dies for each of the clock signal, the mode signal, and the fire signal.

Figure 5:
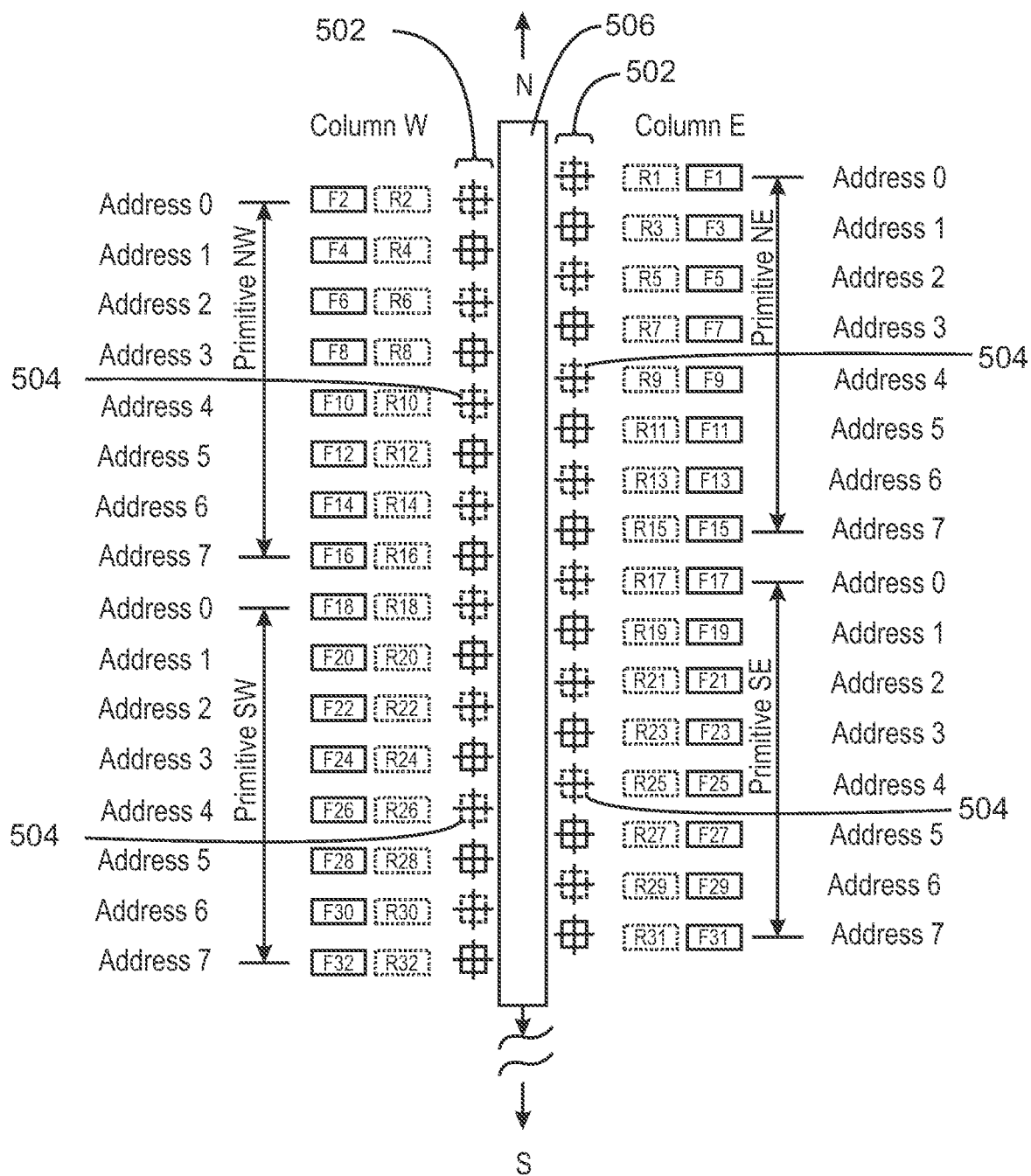
FIG. 5 is a schematic diagram of an example of a set of four primitives, termed a quad primitive.

FIG. 5 is a schematic diagram 500 of an example of a set of four primitives, termed a quad primitive. As described herein, a primitive is a group of fluidic actuators that share a set of address lines. To facilitate the explanation of the primitives and the shared addressing, primitives to the right of the schematic diagram 500 are labeled east, e.g., northeast (NE) and southeast (SE). Primitives to the left of the schematic diagram 500 are labeled west, e.g., northwest (NW) and southwest (SW). In this example, each fluidic actuator 502 is enabled by an FET that is labeled Fx, where x is from 1 to 32, and wherein the FET couples a TIJ resistor for the fluidic actuator 502 to a high-voltage power source (Vpp) and ground. The schematic diagram 500 also shows the TIJ resistors, labeled Rx, where x is also 1 to 32, which correspond to each fluidic actuator 502. Although the fluidic actuators are shown on each side of the ink feed in the schematic diagram 500, this is a virtual arrangement. In some examples, a color die 304 formed using the current techniques would have the fluidic actuators 502 be on the same side of the ink feed.

In this example, is each primitive, NE, NW, SE, and SW, eight addresses, labeled 0 to 7, are used to select a fluidic actuator for firing. In other examples, there are 16 addresses per primitive, and 64 fluidic actuators per quad primitive. The addresses are shared, wherein an address selects a fluidic actuator in each group. In this example, if address four is provided, then fluidic actuators 504, enabled by FETs F9, F10, F25, and F26 are selected for firing. In some examples, firing orders may be offset to minimize fluidic crosstalk between the enabled fluidic actuators 504, as described further with respect to FIG. 12. Which, if any, of these fluidic actuators 504 fire depends on separate primitive selections, which are bit values saved in a data block that is unique to each primitive. A fire signal is also conveyed to each primitive. A fluidic actuator within a primitive is fired when address data conveyed to that primitive selects a fluidic actuator for firing, a data value loaded into a data block for that primitive indicates firing should occur for that primitive, and a firing signal is sent.

In some examples, a packet of fluidic actuator data, referred to herein as a fire pulse group (FPG), includes start bits used to identify the start of an FPG, address bits used to select a fluidic actuator 502 in each primitive data, fire data for each primitive, data used to configure operational settings, and FPG stop bits used to identify the end of an FPG. In other examples, an FPG has no start and stop bits, improving the efficiency of the data transfer. This is discussed further with respect to FIG. 15.

Once an FPG has been loaded, a fire signal is sent to all primitive groups which will fire all addressed fluidic actuators. For example, to fire all the fluidic actuators on the printhead, an FPG is sent for each address value, along with an activation of all the primitives in the printhead. Thus, eight FPG's will be issued each associated with a unique address 0-7. As described herein, the addressing shown in the schematic diagram 500 may be modified to address concerns of fluidic crosstalk, image quality, and power delivery constraints. The FPG may also be used to write a memory element associated with each fluidic actuator, for example, instead of firing the fluidic actuator.

A central fluid feed region 506 may be an ink feed slot or fluid feed holes. However, if the central fluid feed region 506 is an ink feed slot, the logic circuitry and addressing lines, such as the three address lines in this example that are used provide addresses 0-7 for selecting a fluidic actuator to fire in each primitive, are duplicated, as traces cannot cross the central fluid feed region 506. If, however, the central fluid feed region 506 is made up of fluid feed holes, each side can share circuitry, simplifying the logic.

Although the fluidic actuators 502 in the primitives described in FIG. 5 are shown in two columns on opposite sides of the die, for example, on each side of the central fluid feed region 506, these are virtual columns. The location of the fluidic actuators 502 in relation to the central fluid feed region 506 depends on the design of the die, as described in the following figures. In an example, a black die 302 has staggered fluidic actuators on each side of the fluid feed hole, wherein the staggered fluidic actuators are of the same size. In another example, a color die 304 has a line of fluidic actuators down the die, wherein the size of the fluidic actuators in the line of fluidic actuators alternates between larger fluidic actuators and smaller fluidic actuators.

Figure 6:
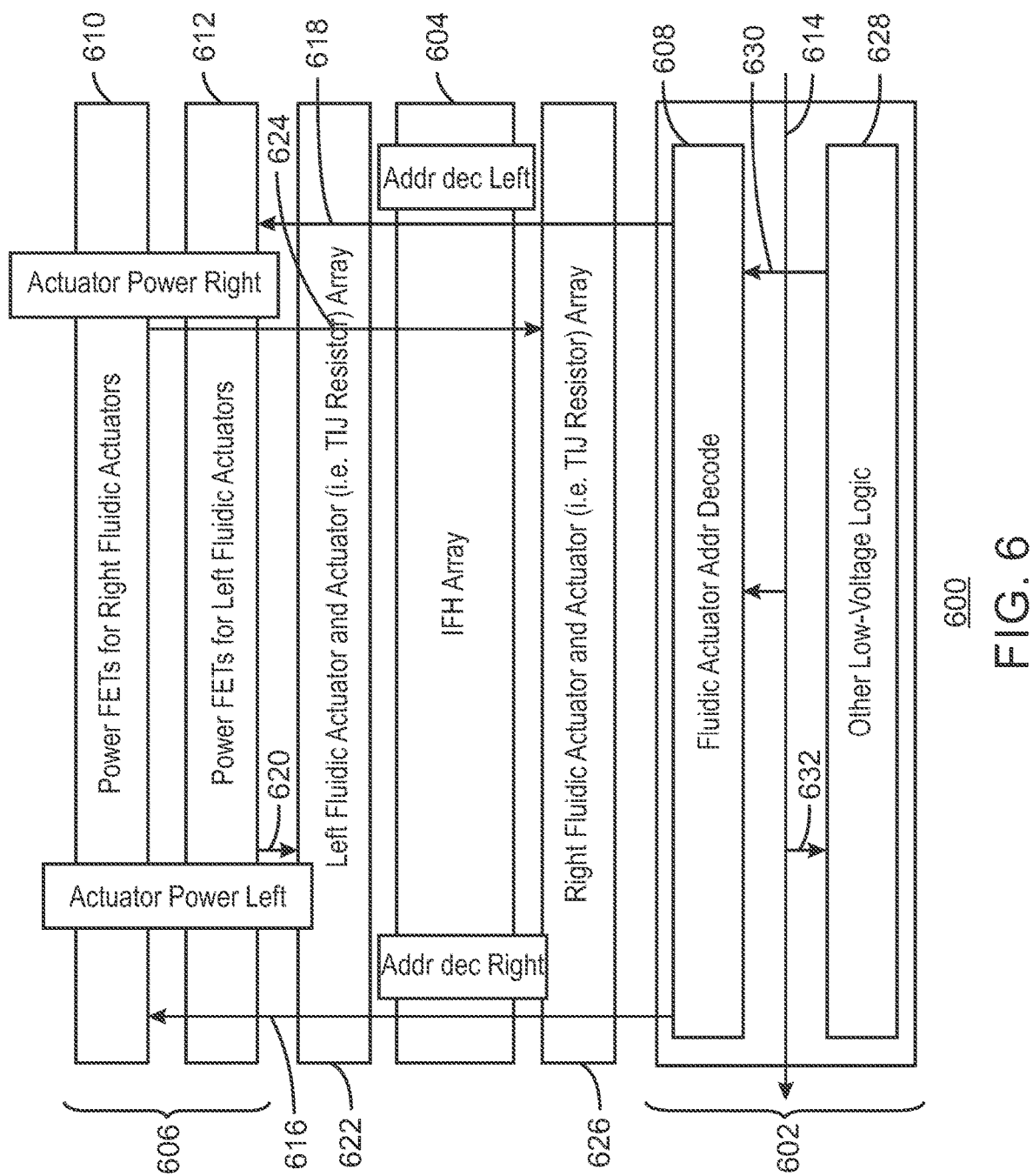
FIG. 6 is a drawing of an example of a layout of the die circuitry, showing the simplification that can be achieved by a single set of fluidic actuator circuitry.

FIG. 6 is a drawing of an example of a layout 600 of the die circuitry, showing the simplification that can be achieved by a single set of fluidic actuator circuitry. In one example, the illustrated layout 600 is associated with a black die 302 where the fluidic actuator and actuator arrays are on either side of the fluid feed holes 204. However, the layout 600 can be used for either the black die 302 or the color die 304.

In the layout 600, low-voltage devices and logic are consolidated on a low-voltage side 602 of the fluid feed hole array 604. High-voltage devices, such as power delivery devices for fluidic actuators, are consolidated on a high-voltage side 606 of the fluid feed hole array 604. As all address decoders 608, including decoders used by the power FETs 610 for the right fluidic actuators and decoders used by the power FETs 612 for the left fluidic actuators, are co-located, a single instance of address data 614 can be routed to the low-voltage side 602 of the fluid feed hole array 604. The address data 614 includes a number of address lines, each carrying a bit of the address data 614. Control signals are then routed across the fluid feed hole array 604, including cross-routings for activation signals 616 for the power FETs 610 for the right fluidic actuators and cross-routings for activation signals 618 for the power FETs 612 for the left fluidic actuators.

Power lines 620 connect the left fluidic actuator array 622 to the power FETs 612 for activation of selected fluidic actuators. Cross-routed power lines 624 are cross routed through the fluid feed hole array 604 to connect the power FETs 610 for the right fluidic actuators and decoders to the right fluidic actuator array 626 for activation of selected fluidic actuators. The cross-routings 616, 618, 624 may be routed between fluid feed holes 202, 320 or between sub-sets of fluid feed holes 202, 320.

In addition to the address decoders 608, the low-voltage side 602 of the fluid feed hole array 604 also has other low-voltage logic 628, including non-address controls, such as fire signals, primitive data, memory elements, thermal sensing, and the like. From this low-voltage logic 628 signals 630 are provided to the address decoders 608 to be combined with address signals for the selection of primitives to be fired. The low-voltage logic 628 may also use address data 632 to select memory elements, sensors, and the like.

Figure 7:
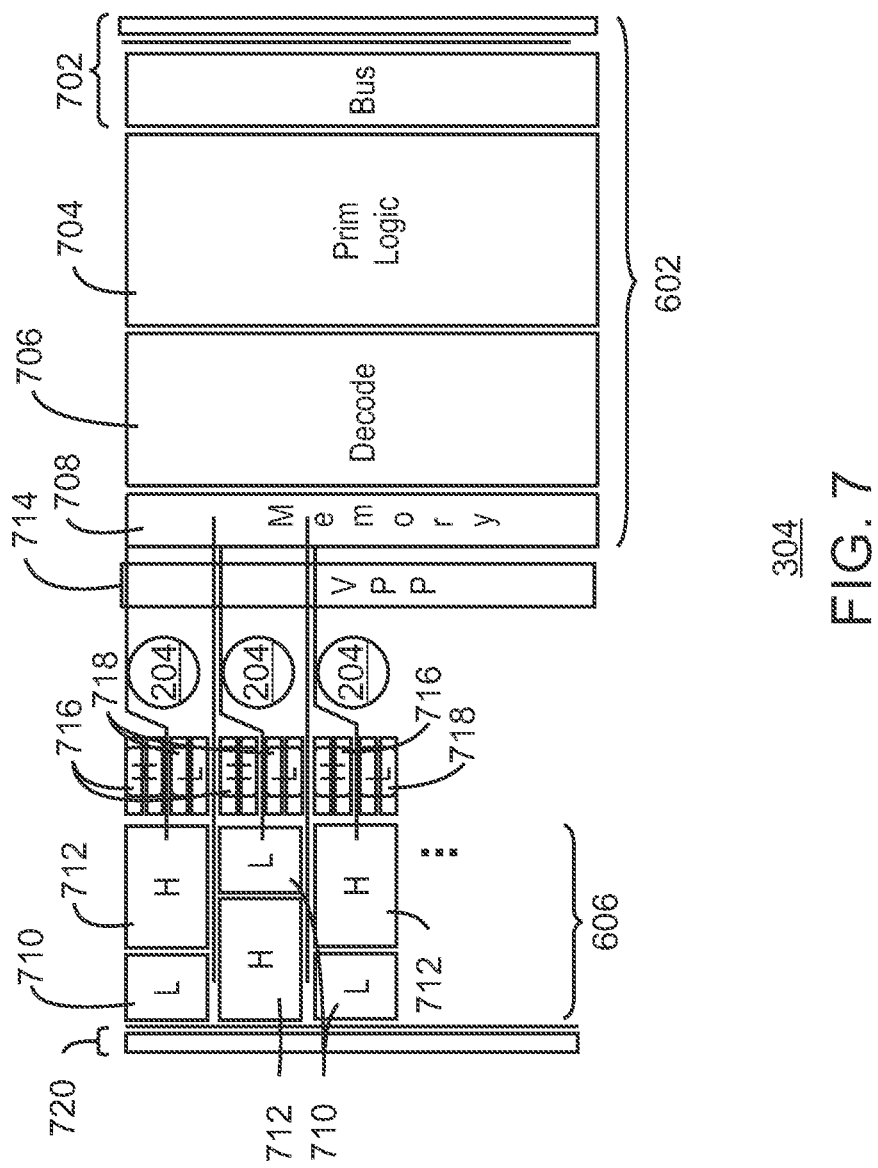
FIG. 7 is a drawing of an example of a circuit floorplan illustrating a number of die zones for a color die.

FIG. 7 is a drawing of an example of a circuit floorplan illustrating a number of die zones for a color die 304. Like numbered items are as described with respect to FIGS. 2, 6, and 7. In the color die 304, a bus 702 carries control lines, data lines, address lines, and power lines for the primitive logic circuitry 704, including a logic power zone that includes a common logic power line (Vdd) and a common logic ground line (Lgnd) to provide a supply voltage at about 2.5 V to about 15 V for logic circuitry. The bus 702 also includes an address line zone including address lines used to provide an address for a fluidic actuator in each primitive group of fluidic actuators. As described herein, the primitive group is a group or subset of fluidic actuators of the fluidic actuators on the color die 304.

An address logic zone includes address line circuits, such as primitive logic circuitry 704 and decode circuitry 706. The primitive logic circuitry 704 couples the address lines to the decode circuitry 706 for selecting a fluidic actuator in a primitive group. The primitive logic circuitry 704 also stores data bits loaded into the primitive over the data lines. The data bits include the address values for the address lines, and a bit associated with each primitive that selects whether that primitive fires an addressed fluidic actuator or saves data.

The decode circuitry 706 selects a fluidic actuator for firing or selects a memory element in a memory zone 708 that includes memory bits, or elements, to receive the data. When a fire signal is received over the data lines in the bus 702, the data is either stored to a memory element in the memory zone 708 or used to activate an FET 710 or 712 in a power circuitry zone on the high-voltage side 606 of the color die 304. Activation of an FET 710 or 712 coupes a corresponding TIJ resistor 716 or 718 to a shared power (Vpp) bus 714. The Vpp bus 714 is at about 25 V to about 35 V. In this example, the traces include power circuitry to power TIJ resistors 716 or 718. Another shared power bus 720 may be used to provide a ground for the TIJ resistors 716 or 718. In some examples, the Vpp bus 714 and the second shared power bus 720 may be reversed.

A fluid feed zone includes the fluid feed holes 204 and the traces between the fluid feed holes 204. For the color die 304, two droplet sizes may be used, which are each ejected by thermal resistors associated with each fluidic actuator. A high weight droplet (HWD) may be ejected using a larger TIJ resistor 716. A low weight droplet (LWD) may be ejected using a smaller TIJ resistor 718. In some examples, the FETs may be the same size for the different sizes of TIJ resistors, which the FET for the smaller TIJ resistors 718 carrying less current. Electrically, the LWD fluidic actuators are in the first column, for example, left, as described with respect to FIG. 6. The HWD fluidic actuators are electrically coupled in a second column, for example, right, as described with respect to FIG. 6. In this example, the physical fluidic actuators of the color die 304 are interdigitated, alternating LWD fluidic actuators with HWD fluidic actuators.

The efficiency of the layout may be further improved by changing the size of the corresponding FETs 710 and 712 to match the power demand of the TIJ resistors 716 and 718. Accordingly, in this example, the size of the corresponding FETs 710 and 712 are based on the TIJ resistor 716 or 718 being powered. A larger TIJ resistor 716 is enabled by a larger FET 712, while a smaller TIJ resistor 718 is enabled by a smaller FET 710. In other examples, the FETs 710 and 712 are the same size, although the power drawn through the FETs 710 that are used to power smaller TIJ resistors 718 is lower.

A similar circuit floorplan may be used for a black die 302. However, as described for examples herein, the FETs for a black die can be the same size, as the TIJ resistors and fluidic actuators are the same size.

Figure 8:
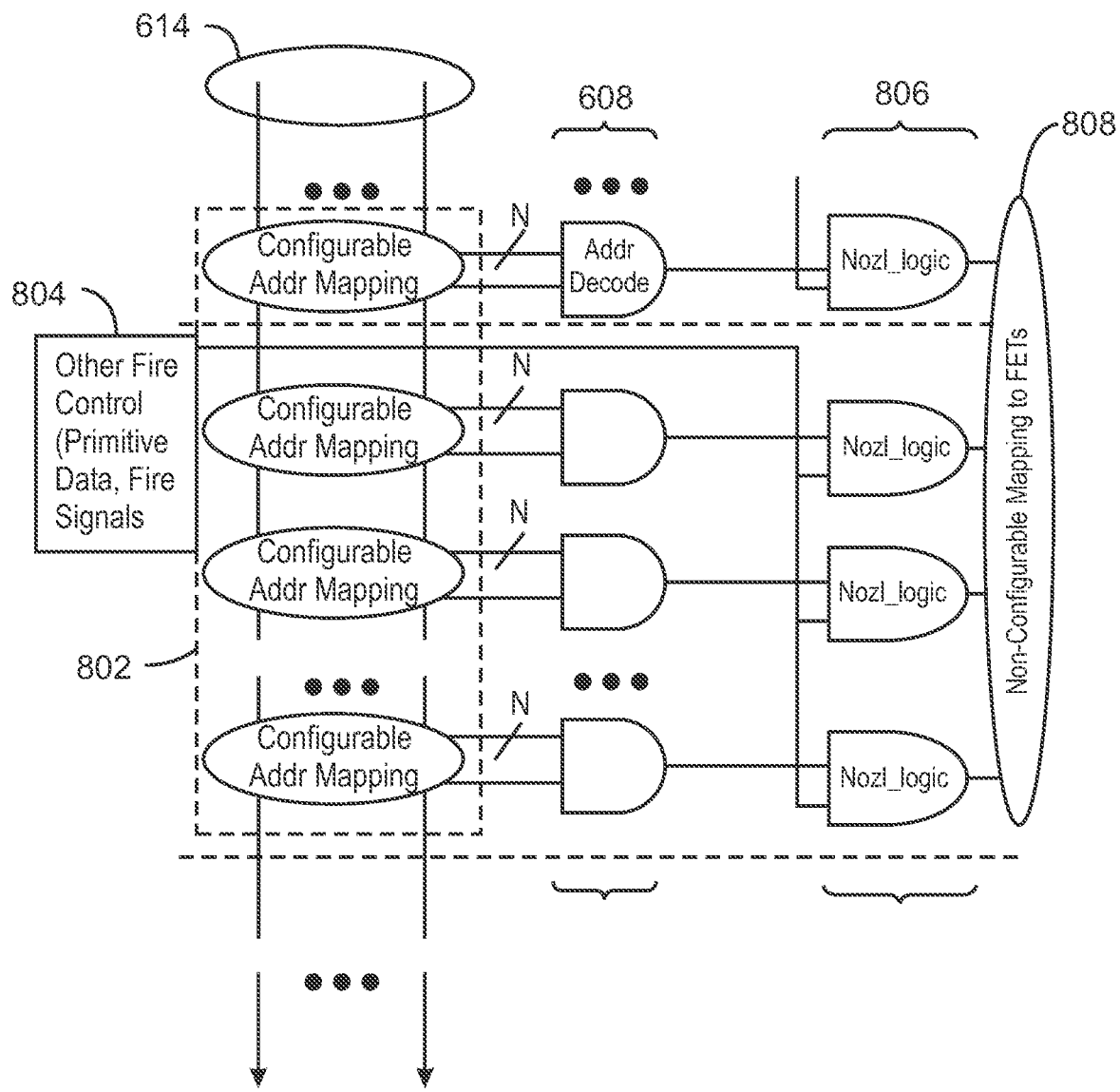
FIG. 8 is a schematic diagram of an example of address decoding on a die.

FIG. 8 is a schematic diagram of an example of address decoding on a die. Like numbered items are as described with respect to FIG. 6. The purpose of address decoding is to take address data 614 and select one fluidic actuator in a primitive to fire. Address decoding can be modified to modify the order that actuators fire in response to a sequence of address data sent to a primitive. Accordingly, the order of firing is optimized per fluidic, electrical, and other system constraints to optimize image quality. As described herein, the primitives on a die may be grouped into columns or arrays. In some examples, the primitives in a column or array utilize the same address decode order.

The address decoding may be modified using configurable address mapping connections 802 that select which address data 614 are used by the decoding logic in the address decoders 608. This may be performed in a post fabrication, or post processing operation, in which connections, or vias, are formed between the address lines and the decoding logic after the initial fabrication of the die is completed. This is discussed further with respect to FIG. 11. In addition to the address decoders 608, other fire control signals 804 are used to activate fluidic actuator logic 806 for selecting and firing a fluidic actuator in a primitive.

In the example of FIG. 8, other connections are formed during the initial fabrication of the die, such as the connections mapped between the address decoders 608 and the fluidic actuator logic 806, and the mapping of the connections 808 between the fluidic actuator logic 806 and the FETs. In this example, these connections, formed during the initial fabrication of the die, are not configurable.

Figure 9:
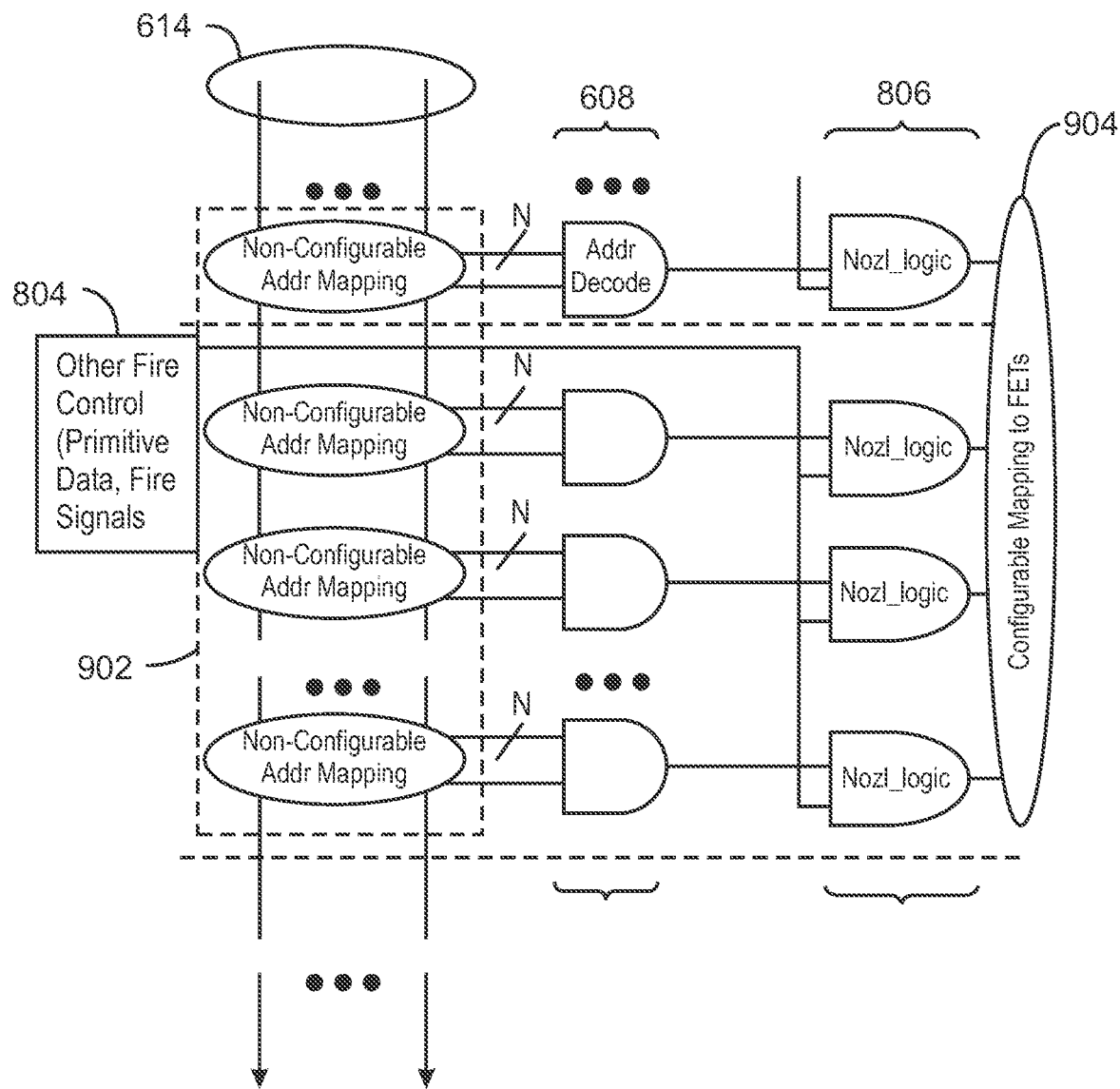
FIG. 9 is a schematic diagram of an example of another implementation of address decoding on a die.

FIG. 9 is a schematic diagram of an example of another implementation of address decoding on a die. Like numbered items are as described with respect to FIGS. 6 and 8. In this example, the address mapping 902 between the address data 614 and the address decoders 608 is non-configurable. Further the address mapping between the address decoders 608 and the fluidic actuator logic 806 is also non-configurable. However, the address mapping 904 between the fluidic actuator logic 806 and the FETs is configurable. In some examples, this is performed during the initial fabrication stage of the die, for example, by routing traces from the low-voltage fluidic actuator logic to more distant FETs.

Mapping connections after the address decoders 608 may be performed using other techniques. In one example, the connections between the address decoders 608 and the fluidic actuator logic 806 is configurable, for example, sending signals from individual address decode blocks to fluidic actuator logic blocks used to activate more distant FETs. Further, in some examples, the address decoders 608 and fluidic actuator logic 806 for a primitive are consolidated into a single logic block, and connections between consolidated logic outputs and actuator FETs are configured to select the firing order.

Figure 10:
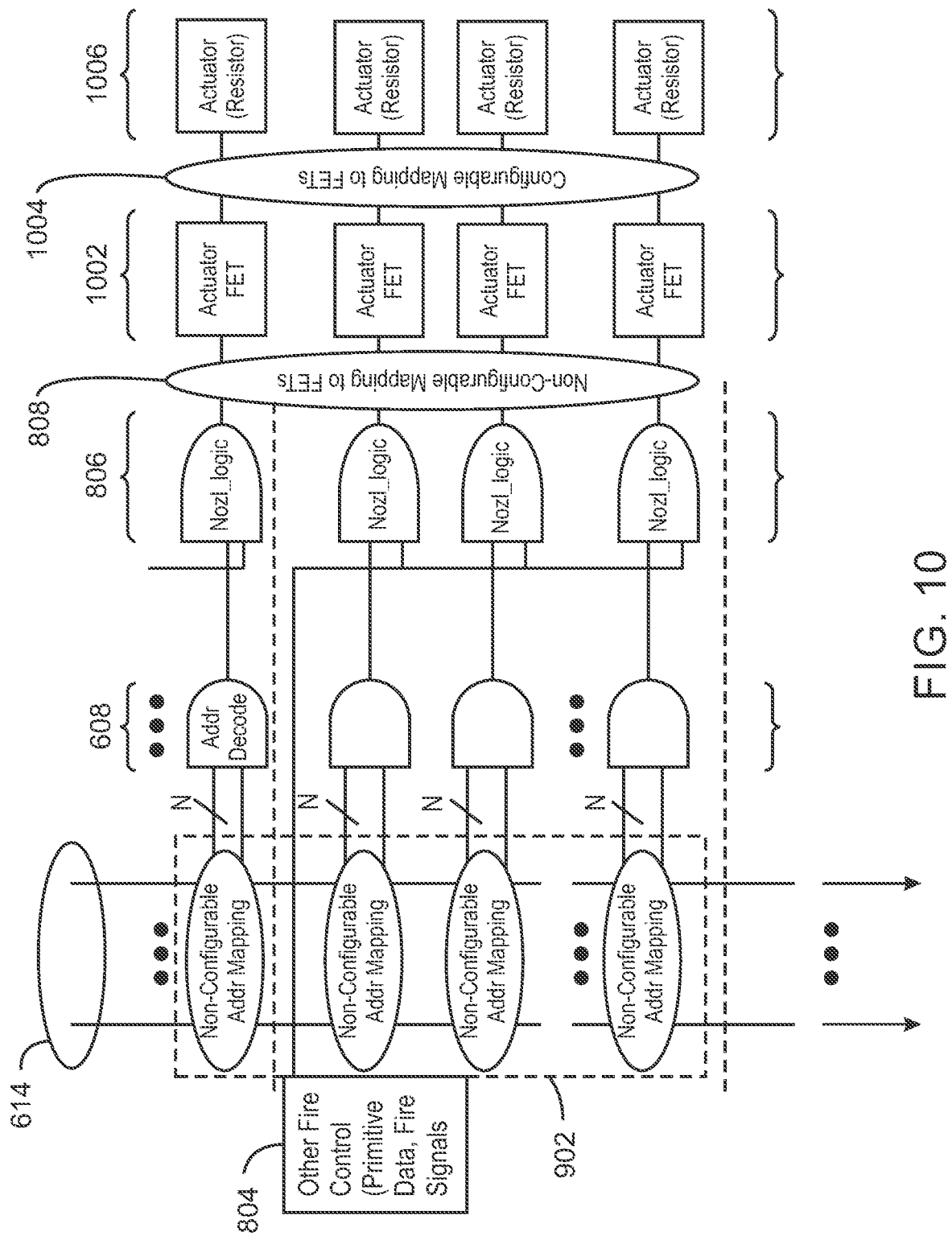
FIG. 10 is a schematic diagram of an example of another implementation of address decoding on a die.

FIG. 10 is a schematic diagram of an example of another implementation of address decoding on a die. Like numbered items are as described with respect to FIGS. 6, 8, and 9. In this example, the address mapping 902 of the address data 614 to the address decoders 608 is not configurable. Further, the mapping of the connections 808 of the fluidic actuator logic 806 to the FETs 1002 is also not configurable. However, the mapping 1004 of the FETs 1002 to the fluidic actuators 1006, for example, the thermal resistors, is configurable. In examples, the mapping 1004 is performed during the initial fabrication to map FETs 1002 to fluidic actuators 1006 located a further distance, for example, bypassing closer fluidic actuators 1006.

Although the examples in FIGS. 8 to 10 show three individual techniques for mapping, in which the other mapping techniques are indicated as non-configurable, the techniques are not limited to that. For example, multiple mapping techniques may be used during the processing. In some examples, the address mapping 904 between the fluidic actuator logic 806 and the FETs is configurable, as described with respect to FIG. 9 and the mapping of the connections 802 that select which address data 614 are used by the decoding logic in the address decoders 608, as described with respect to FIG. 8, is also configurable.

Figure 11:
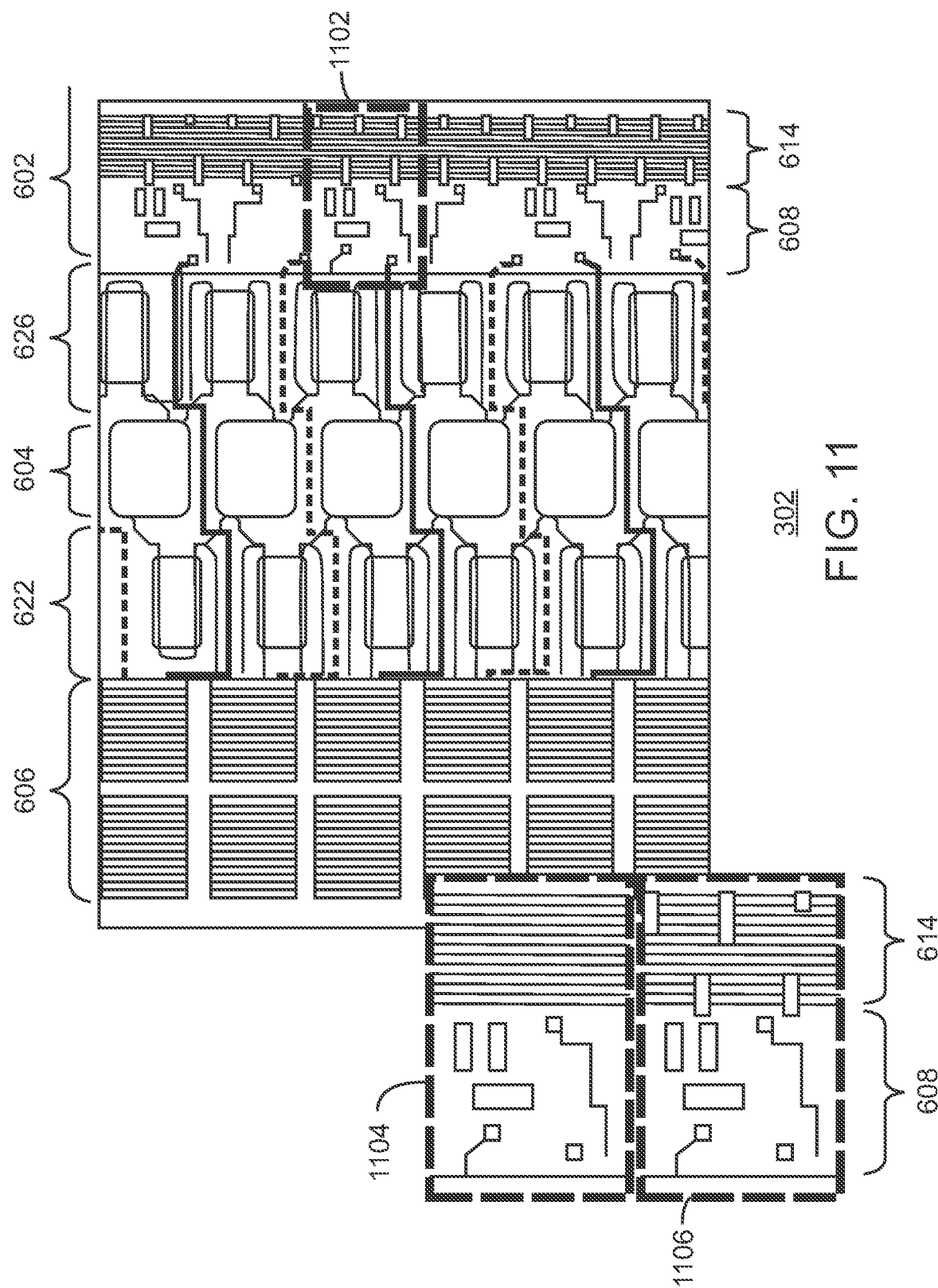
FIG. 11 is a drawing of an example of a black die showing the formation of vias from the address lines to the logic circuitry.

FIG. 11 is a drawing an example of a black die 302 showing the formation of vias from the address lines to the logic circuitry. Like numbered items are as described with respect to FIGS. 3 and 6. In this drawing, a box 1102 illustrates the coupling between the address data 614 and the address decode 608. As described with respect to FIG. 8, After the initial fabrication, the address data 614 is not coupled to the address decode 608 as the mask configurations of the vias has not been completed, as shown in the expanded view of block 1104. After secondary processing is completed, the expanded view of block 1106 shows the completed vias between the address decode 608 and the address data 614. Although FIG. 11 is directed to a black die 302, similar connections between the address data 614 and the address decode 608 would be made for the color die 304.

Figure 12:
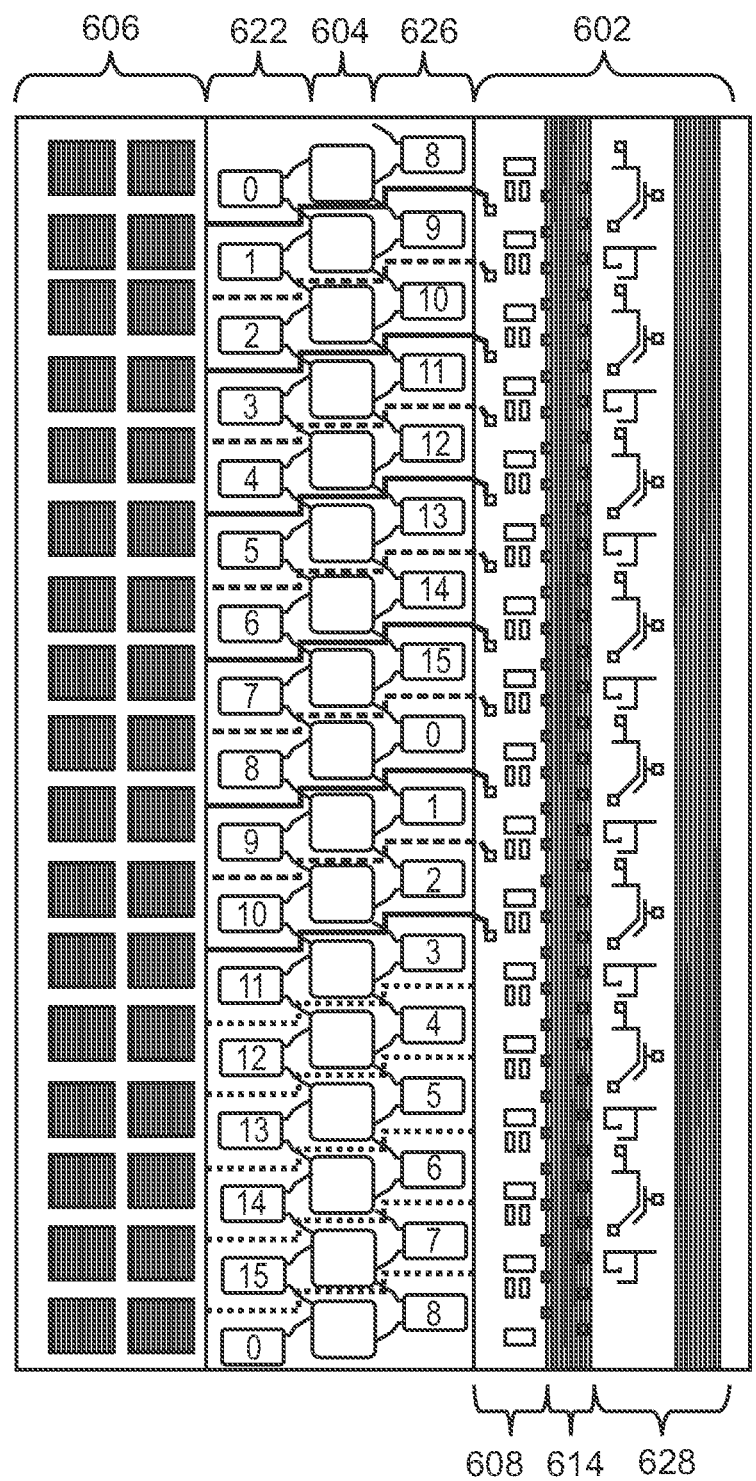
FIG. 12 is a drawing of an example of a black die showing an offset in address order of primitives between fluidic actuator columns on each side of the fluid feed hole array, in accordance with example.

FIG. 12 is a drawing of an example of a black die 302 showing an offset in address order of primitives between fluidic actuator arrays 622 and 626 on each side of the fluid feed hole array 604, in accordance with example. Like numbered items are as described with respect to FIGS. 3 and 6. FIG. 12 shows primitives, each with 16 fluidic actuators, with one primitive on each side of the fluid feed hole array 604. In this example, an offset of eight in the address orders between the left fluidic actuator array 622 and the right fluidic actuator array 624 has been implemented by the use of mask configurable connections between the address decode 608 and the address data 614. This enables a print system to send a single set of address data 614, which is decoded for fluidic actuators on both sides of the fluid feed hole array 604.

Thus, based on the configuration of the connections between the address data 614 and the address decode 608, the address is offset by a desired amount. As a result, fluidic constraints, for example, in a fluid flow through the fluid feed hole array 604 to actuators on either side of the fluid feed hole array 604 are less problematic.

Figure 13:
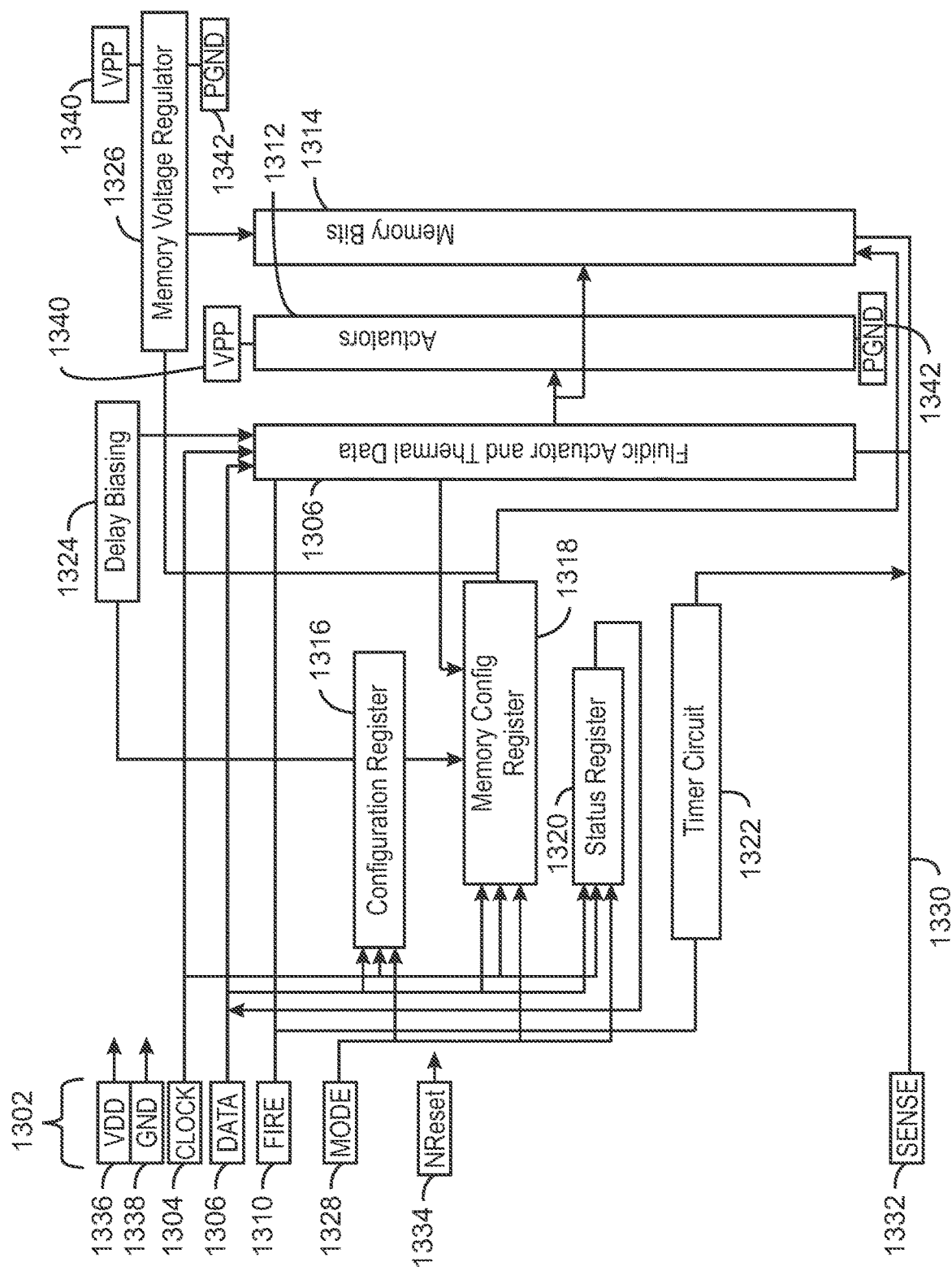
FIG. 13 is an example of a circuit diagram of a die.

FIG. 13 is an example of a circuit diagram 1300 of a die. In one example, memory elements and sensors, such as thermal sensors, are included on the die. The memory elements may include data blocks and memory bits. In one example, a thermal measurement and control system can be provided off-die, for example on a host print device ASIC. Accordingly, external control circuitry, for example, the ASIC, can support multiple dies on a shared sense bus. In one example, this provides for a relatively simple design associated with a relatively small amount of silicon in the die, and relatively low costs.

External connections, or pads, 1302 are used to access functions of the die. The pads 1302 include a clock pad 1304 used to provide a clock signal for loading data. As described further herein, data at a data pad 1306 is loaded into one actuator column in a data store 1308, for example, the left column, on a rising clock edge, and loaded into a second actuator column in the data store 1308, for example, the right column, on a falling clock edge. As each new set of data bits is loaded into the first and second actuator columns, the previous data bit in those location is shifted into a new location, for example, acting as a large shift register. This is described further with respect to FIG. 15.

A fire signal is provided through a fire pad 1310 and is used to either trigger a fluidic actuator in an actuator array 1312 that has been selected through address bits in the data stream, or to trigger a memory access to memory bits 1314 that share an address with a corresponding TIJ resistor in the actuator array 1312.

The die has registers that may be used for configuration parameters. It may be noted that the term register, as used herein, includes any number of storage configurations, including shift registers, flip-flops, and the like. These include, for example, a configuration register 1316, a memory configuration register 1318, and a status register 1320.

In some examples, the configuration registers 1316 and 1318 are write only. A confirmation of the bits that were written is made by the behavior of the die. Eliminating read access to the registers 1316 and 1318 decreases the circuit count and saves some area on the die. The memory configuration register 1318 is a shadow register, paralleling the configuration register 1316, but is only enabled for writing when certain complex conditions are met, such as fluidic actuator data bits and configuration register data bits set in a certain order, along with specific input pad states. The status register 1320 is used to read data to identify a die failure or a revision value and is also used for test purposes for integrated circuit testing during manufacturing.

In addition to the registers 1316, 1318, and 1320, the die has analog blocks, including, for example, a timer circuit 1322, a delay biasing controller 1324, and a memory voltage regulator 1326. A mode pad 1328 is used to select various operating modes, such as loading configurations from the data pad 1306 into the configuration register 1316 or into the memory configuration register 1318. The mode pad 1328 can also be used to select what sensors are connected to the sense bus 1330 that is read out through the sense pad 1332, including, for example, thermal sensors, or memory bits 1314, among others. In some examples, an NReset pad 1334 is used to accept a reset signal to all functional blocks of the die, forcing them to return to an initial configuration. This may be performed, for example, if the timer circuit 1322 reports a problem from the die to the external ASIC, for example, from a timeout condition.

In addition to the signal pads 1304, 1306, 1310, 1328, 1332, and 1334, mentioned above, four power pads 1336, 1338, 1340, and 1342 are used provide power to the die. These include a Vdd pad 1336 and a Lgnd pad 1338 to provide low-voltage power to the logic circuitry. A Vpp pad 1340 and a Pgnd pad 1342 provide high-voltage power for activating the TIJ resistors of the actuator array 1312 and providing power to the memory voltage regulator 1326 used to provide a higher voltage for writing memory bits 1314. The memory voltage regulator 1326 may be designed to program multiple memory bits 1314 simultaneously.

Figure 14:
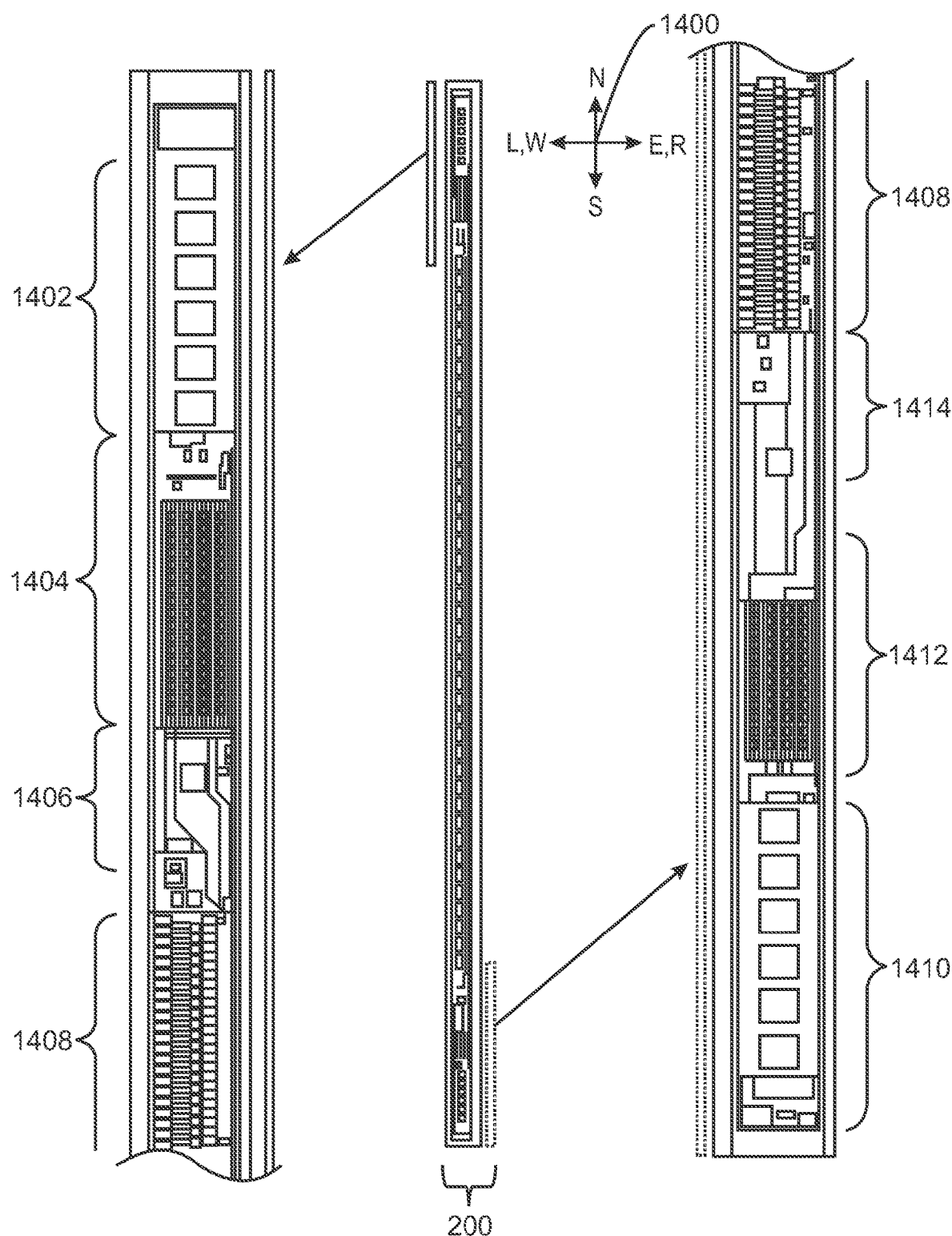
FIG. 14 is a drawing of an example of a die showing the interface pads and logic locations used to load data and control signals into the die.

FIG. 14 is a drawing of an example of a die 200 showing the interface pads and logic locations used to load data and control signals into the die. To clarify the layout, a directional rosette 1400 is included to indicate the reference direction on the front face of the die. Specifically, the long dimension of the die may be indicated by a north-south axis, while the narrow dimension of the die may be indicated by a west-east (or left-right) axis. The 12 interface pads described with respect to FIG. 13 are divided and placed at each end of the die. The north pads 1402 are six pads located at the north end of the die. Moving from the top or north end of the die, a digital control north 1404 includes logic circuitry to decode the serially loaded data and load it into configuration or address registers. A section termed address configuration north 1406 is used to map the address data to address lines running the length of the die. Most of the die is occupied by a region 1408 that includes column primitives, fluidic actuators, and power FETs. The memory bits may be located in the digital control north 1404 or in the digital logic sections of the region 1408.

Another set of pads are located at the south in the of the die. The south pads 1410 provide the remaining portion of the 12 pads discussed with respect to FIG. 13. These are adjacent to a digital control south 1412 which, as for digital control north 1404, is used to decode serially loaded data and load address bits into address registers. The address configuration south 1414 maps this set of address bits on to another set of address lines running the length of the die.

Figure 15:
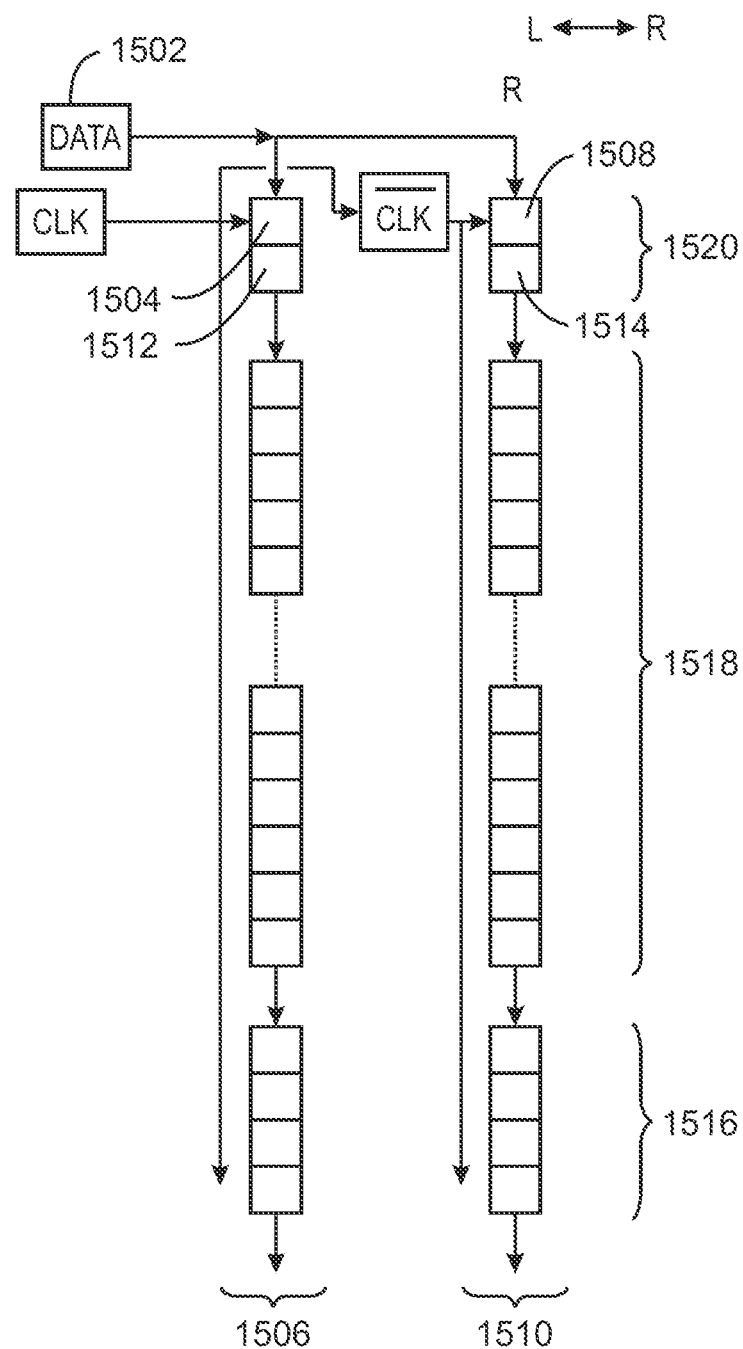
FIG. 15 is a schematic diagram an example of the serial loading of data into the data store.

FIG. 15 is a schematic diagram an example of the serial loading of data into the data store 1308. Like numbered items are as described with respect to FIG. 13. In the schematic diagram, a value for a data bit (zero or one) is placed onto the data line 1502. Upon a rising clock edge, the data bit is loaded into the first data block 1504 of the left column 1506 of the data store 1308. As used herein, a data block may be a memory element, a flip-flop, or other decoders or storages used for saving and/or shifting a bit value. Another data value is then placed onto the data line 1502. Upon a falling clock edge, the new data bit is loaded into the first data block 1508 of the right column 1510 of the data store 1308. As each successive data bit is loaded into the columns 1506 and 1510 of the data store 1308, the prior data bit stored in the data blocks 1504 and 1508 are shifted to the next data blocks 1512 and 1514 of the data store 1308. This continues until a full set of data is loaded into the data store 1308.

As described herein, the data loaded is termed a fire pulse group (FPG). Once the data is fully loaded into the data store 1308 the initial data, termed head data 1516 herein, is in the final data blocks of the data store 1308. In some examples, the head data 1516 includes address bits and control bits. In other examples, the bit order is rearranged, and the head data 1516 only includes address bits. The following data, termed fluidic actuator data 1518 herein, includes a bit value in each data block for each primitive. The bit value indicates if a fluidic actuator in that primitive is to be fired. In this example, each primitive includes 16 fluidic actuators, as described with respect to FIG. 12. In some examples, there are 256 primitives, although the number of primitives depends on the design of the die. For example, some dies may include 128 primitives, 512 primitives, 1024 primitives, or more. All of the number of primitives is shown as a power of two in these examples, the number is not limited to powers of two, and may include about 100 primitives, about 200 primitives, about 500 primitives, and the like. The last set of data, termed the tail data 1520 herein, may include address bits and other control bits, such as memory control bits, thermal control bits, and the like. In this example, only 21 primitives are shown on each side. However, as described herein, any number of primitives may be included.

In the example FPG data of Table 1, the address data is split between the head data 1516 and the tail data 1520. This allows the addressing circuitry to be split between the digital control north 1404 and the digital control south 1412, described with respect to FIG. 14. By including the control information in both the head and tail of the FPG, die circuits that read the head and tail information may be segmented to allow the circuits to be spread out, which, for certain examples, may help to achieve a relatively narrow die footprint. However, in some examples, the addressing, thermal control bits, and other control bits may be located completely in the head or tail of the FPG, with the control circuitry completely located at one end of the die.

TABLE 1

Exemplary FPG data
FPG data

| Type | Rising Clock Edge | Falling Clock Edge |
| --- | --- | --- |
| Head Data | Header bit 1 | Header bit 2 |
| | Header bit 3 | Header bit 4 |
| | Header bit 5 | Header bit 6 |
| | Header bit 7 | Header bit 8 |
| Fluidic Actuator Data | Left prim[21] | Right prim[21] |
| | Left prim[21] | Right prim[21] |
| | Left prim[21] | Right prim[21] |
| | Left prim[21] | Right prim[21] |
| | . . . | . . . |
| | Left prim[21] | Right prim[21] |
| Tail Data | Tail bit 1 | Tail bit 2 |
| | Tail bit 3 | Tail bit 4 |

Thus, in a normal operating mode, in which the mode pad 1328 described with respect to FIG. 13 has a value of zero, the data is shifted into the data blocks of the data store 1308 on both the positive edge and negative edge of the clock pulses, as described herein. In some examples, the fire pad 1310 is driven from 0 to 1 to 0 to 1 to 0 as a firing signal to fire a fluidic actuator. In this example, the two positive pulses are used to allow other pulse sequences to control warming of the die and memory access.

Figure 16:
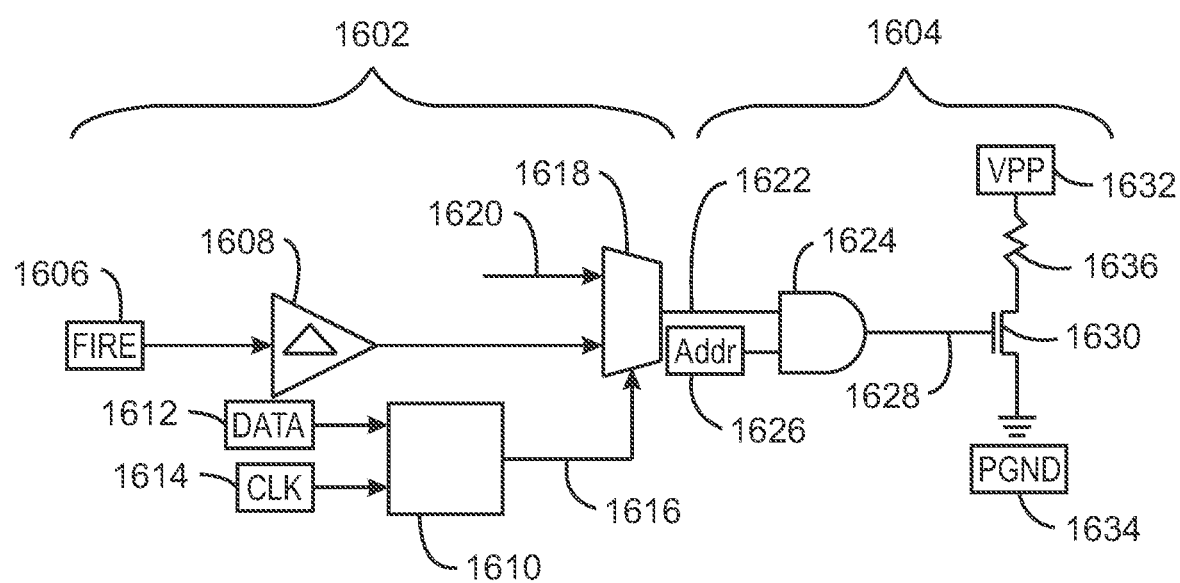
FIG. 16 is a circuit diagram an example of a logical function for firing a single fluidic actuator in a primitive.

FIG. 16 is a circuit diagram an example of a logical function 1600 for firing a single fluidic actuator in a primitive. Referring also to FIGS. 8 to 12, the logical function 1600 is shown therein as fluidic actuator logic 806. As described herein, primitives may include 16 fluidic actuators. Each primitive will share the first logic circuits 1602, while each fluidic actuator will have the second logic circuits 1604 associated the logical function 1600.

For the first logic circuit 1602, shared by all the fluidic actuators in a primitive, a fire signal 1606 is received from a shared fire bus that is coupled to all primitives in a die. The shared fire bus receives the fire signal 1606 from the fire pad 1310, described with respect to FIG. 13. The fire signal 1606 is generated in the external ASIC. In this example, the fire signal 1606 is provided to an analog delay block 1608, for example, to tune the firing of the primitive for synchronization with other primitives. Each primitive has an associated data block 1610 as described for the fluidic actuator data 1518 of FIG. 15. The data block 1610 is loaded from a data line 1612, which comes from a data block for a previous primitive or control value. As described herein, the data block 1610 is loaded on a rising edge of a clock pulse 1614 for a primitive located in the left column, or on the following edge of a clock pulse 1614 for a primitive located in the right column. The data 1616 from the data block 1610 is used in an OR/AND gate 1618 to allow either a warm pulse 1620 or the fire signal 1606 to pass through as an activation pulse 1622. Specifically, if the data 1616 is high, then either the fire signal 1606 or the warm pulse 1620 is passed as an activation pulse 1622.

In the second logic circuits 1604 associated with each fluidic actuator, an AND gate 1624 receives the activation pulse 1622, which is shared with the AND gates for all the fluidic actuators in the primitive. An address line 1626 comes from the address decode 608, described with respect to FIG. 6. When both the activation pulse 1622 and the address line are high, the AND gate 1624 passes a control signal 1628 to a power FET 1630. The power FET 1630 10 switches on, allowing current to flow from Vpp 1632 to Pgnd 1634 through a TIJ resistor 1636. A fire signal 1606 may provide a signal for a long enough time to cause heating of fluid in the fluidic actuator, leading to ejection of a droplet. In contrast, a warm pulse 1620 may be of shorter duration, allowing the use of the TIJ resistor 1636 to heat the die proximate to the fluidic actuator in the primitive.

Figure 17:
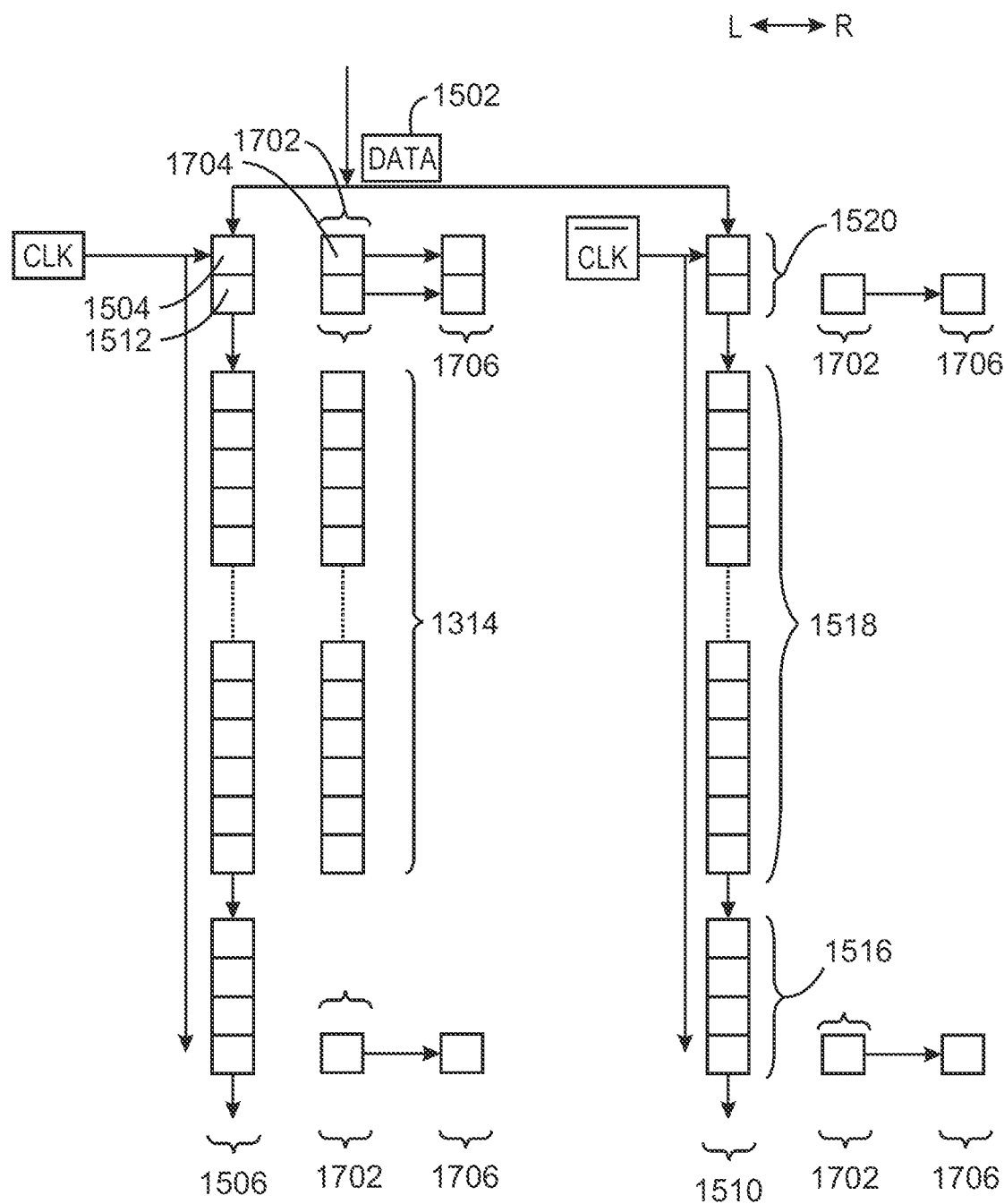
FIG. 17 is an example of a schematic diagram of memory bits shadowing primitive blocks in the data store.

FIG. 17 is an example of a schematic diagram of memory bits 1314 shadowing primitive blocks in the data store 1308. Like numbered items are as described with respect to FIGS. 13 and 15. In this example, memory bits are associated only with the left column 1506 of fluidic actuator data, although other examples may have memory bits associated with both columns 1506 and 1510 of the data store 1308. The memory bits 1314 are accessed with a combination of fluidic actuator data, firing address, and, in some examples, configuration register bits.

The head data 1516 and tail data 1520 are not associated with memory bits 1314. However, the address bits may have special memory bits 1702 associated for die configuration.

The memory bits are associated with both rising edge and falling edge input data. A memory lockdown bit 1704 may be used to prevent writing to some, or all, of the memory bits 1314. In some examples, the special memory bits 1702 are transferred into nonvolatile latches 1706 upon exiting a reset state.

Figure 18:
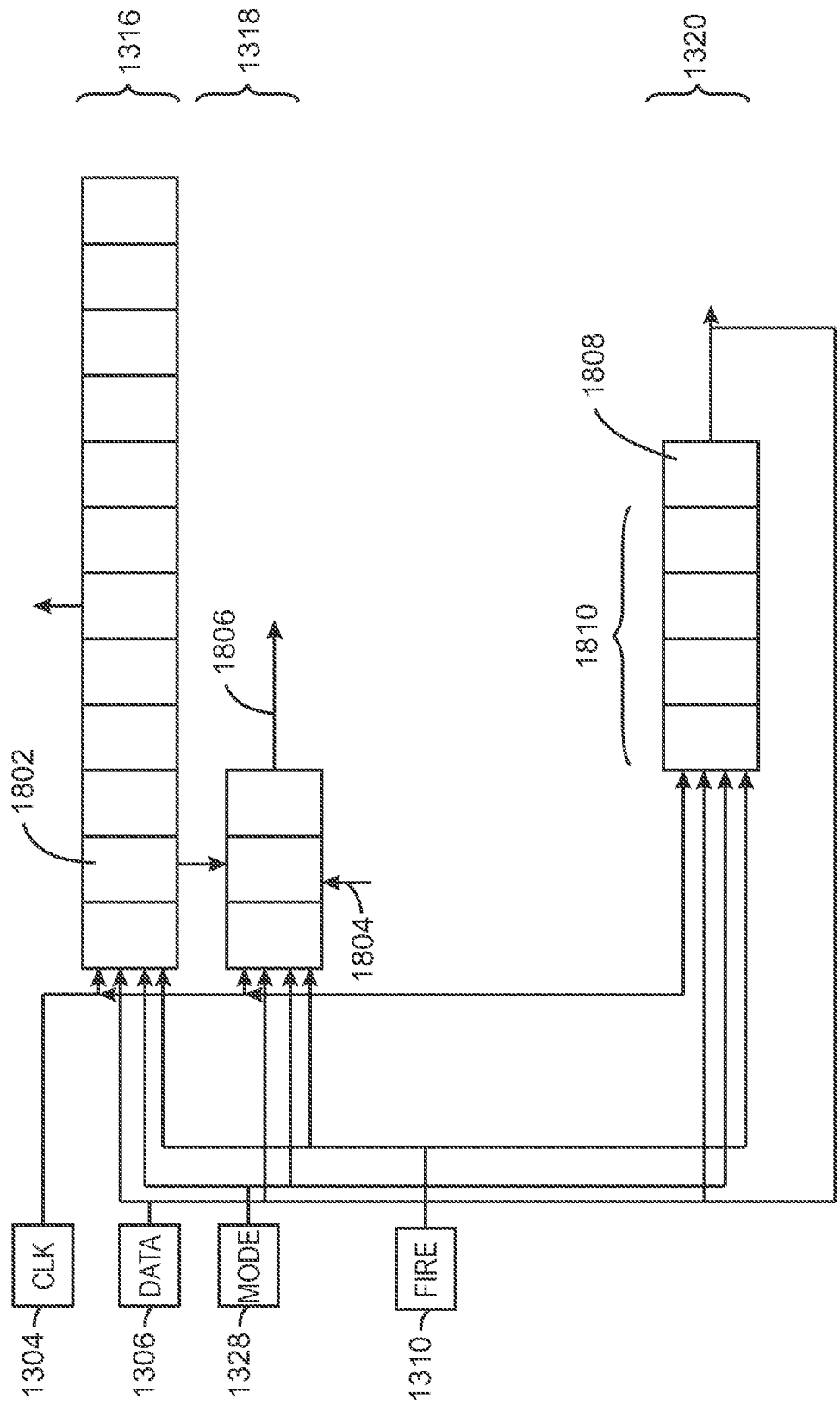
FIG. 18 is an example of a block diagram of the configuration register, the memory configuration register, and the status register.

FIG. 18 is an example of a block diagram of the configuration register 1316, the memory configuration register 1318 and the status register 1320. Like numbers items are as described with respect to FIG. 13. As described herein, the configuration register 1316 is write only and uses a special configuration to enable writing. In one example, the configuration register 1316 is enabled for writing when the mode pad 1328 is high, data is high, and upon the first positive edge of the clock signal. After the configuration register 1316 is enabled for writing, further clock pulses will shift data through the configuration register 1316.

The memory configuration register 1318 is further protected from writing through a special sequence of bits in the configuration register 1316, control signals, and the FPG packet data. For example, setting a memory configuration bit 1802 in the configuration register 1316 along with a bit from fluidic actuator data 1804 enables writing to the memory configuration register 1318. The memory configuration register 1318 may then provide memory control bits 1806 to the data store 1308 and memory bits 1314, for example, to enable access to the memory bits 1314. In some examples, the memory bits 1314 accessed for writing are provided from the corresponding data blocks of the fluidic actuator data 1518, for example, from the data blocks having the same addresses as the selected memory bits 1314.

In some examples, the fire pad 1310 is kept high to allow memory access. When the fire pad 1310 falls to low, the bits in the memory configuration register 1318, as well as the memory configuration bit 1802 in the configuration register 1316 are cleared. In addition to this example, any number of other techniques may be used to enable access to the memory configuration register 1318, and to the memory bits 1314.

The status register 1320 may be a read only register that records information about the die. In an example, reading of the status register 1320 is enabled when the mode pad 1328 is high, the data value on the data pad 1306 is high, and a rising clock edge occurs. In this example, the fire pad 1310 is then raised to high, allowing data in the status register to be shifted out and read through the data pad 1306, as the signal on the clock pad 1304 rises and falls. In some examples, the status register 1320 includes a watchdog failed bit 1808 that is set high to indicate an error condition, such as a timeout. Other bits in this example may include revision bits 1810, for example, indicating the revision number of the die. In other examples, more bits are used in the status register 1320, for example, to indicate other conditions, to add bits to the revision number, or to provide other information about the die.

Figure 19:
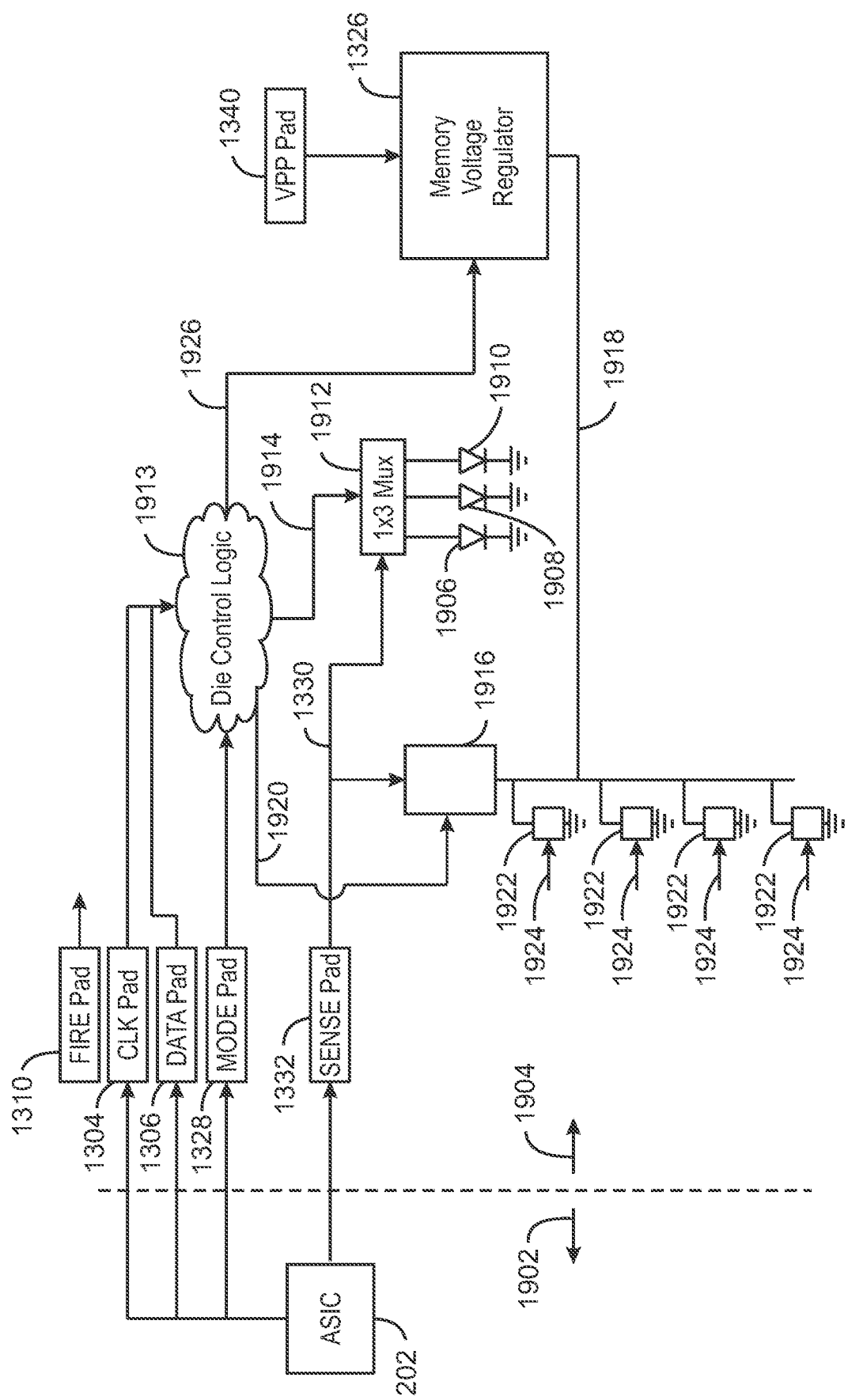
FIG. 19 is a schematic drawing of an example of a die showing a sense bus for reading and programming memory bits and accessing thermal sensors.

FIG. 19 is a schematic drawing of an example of a die 1900 showing a sense bus 1330 for reading and programming memory bits and accessing thermal sensors. Like numbered items are as described with respect to FIGS. 2 and 13. In the schematic drawing, the division of functions between the ASIC 202 of the printer 1902 and the die 1900 of the printhead 1904 is illustrated.

In some examples, the dies discussed herein use a memory architecture based on non-volatile memory (NVM) bits that are one-time-programmable (OTP). The NVM memory bits are written using a special access sequence to enable the memory voltage regulator 1326. This on-die regulator circuit generates the high-voltage potential required to program the memory bits, for example, at about 11 V. However, metal oxide semiconductors have a maximum operating voltage of about 2.5 V to about 6 V. If this low-voltage is exceeded, the devices may be damaged. Accordingly, the architecture of the die includes high-voltage capable devices to provide high-voltage isolation of low-voltage devices from the write mode voltage generated on-die.

The designs described herein may reduce system interconnects by providing on-die voltage generation in the memory voltage regulator 1326 to write memory bits with no additional electrical interface pads. Further, on-die high-voltage protection circuit may prevent damage to low-voltage devices connected to the sense bus 1330 during memory write, allowing the memory bits to be read through the sense pad 1332. The regulator design may be of relatively low complexity, which may be associated with a relatively small circuit area foot print.

In various examples, the sense bus 1330 is connected to thermal diode sensors 1906, 1908, and 1910, through a multiplexer 1912, under the control of the control lines 1914 set by bit values loaded into die control logic 1913, which may include the configuration register 1316 and the memory control register 1318, among other circuits. The number of thermal diode sensors is not limited to three, in other examples, there may be five, seven, or more, such as one thermal sensor per primitive. The thermal diode sensors 1906, 1908, and 1910 are used to measure the temperature of the die, for example, at the north end, the south end, and in the middle. The control lines 1914 from the die control logic 1913 select which of the thermal diode sensors 1906, 1908, or 1910 is coupled to the sense bus 1330. The control lines 1914 may also be used to deselect or disconnect all three thermal diode sensors 1906, 1908, and 1910 from the sense bus 1330, for example, when memory, crack detectors, or other sensors are connected. In this example, all of the control lines 1914 may be set to zero to deselect the thermal diode sensors 1906, 1908, and 1910.

In addition to being connected to the thermal diode sensors 1906, 1908, and 1910, the sense bus 1330 is used to read programmable memory bits through a high-voltage protection switch 1916 coupled to a memory bus 1918. During a read procedure, the high-voltage protection switch 1916 is activated to communicatively couple the memory bus 1918 to the sense bus 1330, for example, through a control line 1920 set by a bit value in the die control logic 1913, such as in the memory configuration register 1318. Individual bits 1922 are selected through bit enable lines 1924 and accessed through combinations of values imposed on other pads, for example, a bit enable may be activated by a combination of a memory mode bit in the configuration register, primitive address data, and a fire pulse.

A write sequence may use the bit enable logic, combined with a specific sequence to disable the high-voltage protection switch 1916, which disconnects the memory bus 1918 from the sense bus 1330. A control line 1926 from the die control logic 1913, may be used to activate the memory voltage regulator 1326. The memory voltage regulator 1326 is supplied a voltage from the Vpp pad 1340 of about 32 V. The memory voltage regulator 1326 then converts this to a voltage of about 11 V and places the 11 V on the memory bus 1918 during a write procedure.

Once the write procedure is finished, the memory voltage regulator 1326 is deactivated, dropping the voltage on the memory bus 1918, which may then be pulled to a ground potential. Once the write sequence is not active, a memory read may be performed by setting a bit value in the die control logic 1913, such as in the memory control register 1318, to enable the high-voltage protection switch 1916, and couple the memory bus 1918 to the sense bus 1330. As the sense bus 1330 is a shared, multiplexed bus, during memory read procedures, the multiplexer 1912 is deactivated, disconnecting the thermal diode sensors 1906, 1908, and 1910 from the sense bus 1330. Similarly, during thermal read operations, the high-voltage protection switch 1916 is disabled, disconnecting the memory bus 1918 from the sense bus 1330.

Figure 20:
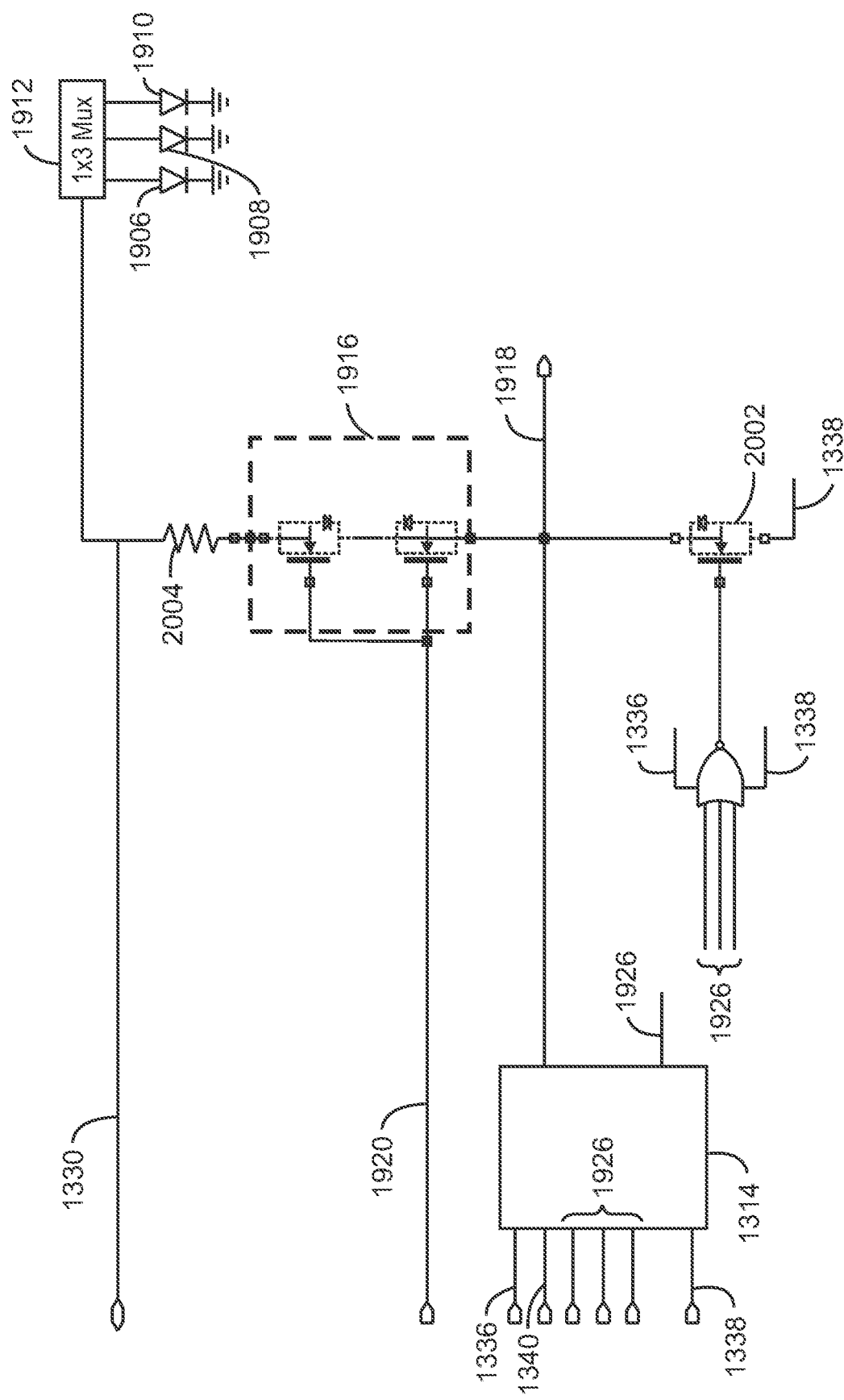
FIG. 20 is a circuit diagram of an example of a high-voltage protection switch used to protect lower voltage MOS circuitry from damage from high-voltage.

FIG. 20 is a circuit diagram of an example of a high-voltage protection switch 1916 used to protect lower voltage MOS circuitry from damage from high-voltage. Like numbered items are as described with respect to FIGS. 13 and 19. In the example shown in FIG. 20, the high-voltage protection switch 1916 includes two back-to-back, high-voltage MOSFETs, each with back body diodes. These two high-voltage capable devices provide protection between the 11 V of the programming mode and the lower voltage logic, for example, less than about 3.6 V, connected to the sense bus 1330. In some examples, when the memory voltage regulator 1326 is deactivated, another MOSFET 2002 may be used to pull the memory bus 1918 to ground. This MOSFET 2002 may be disabled during a memory read sequence. A resistor 2004 may be included to protect from latch-up conditions.

Figure 21:
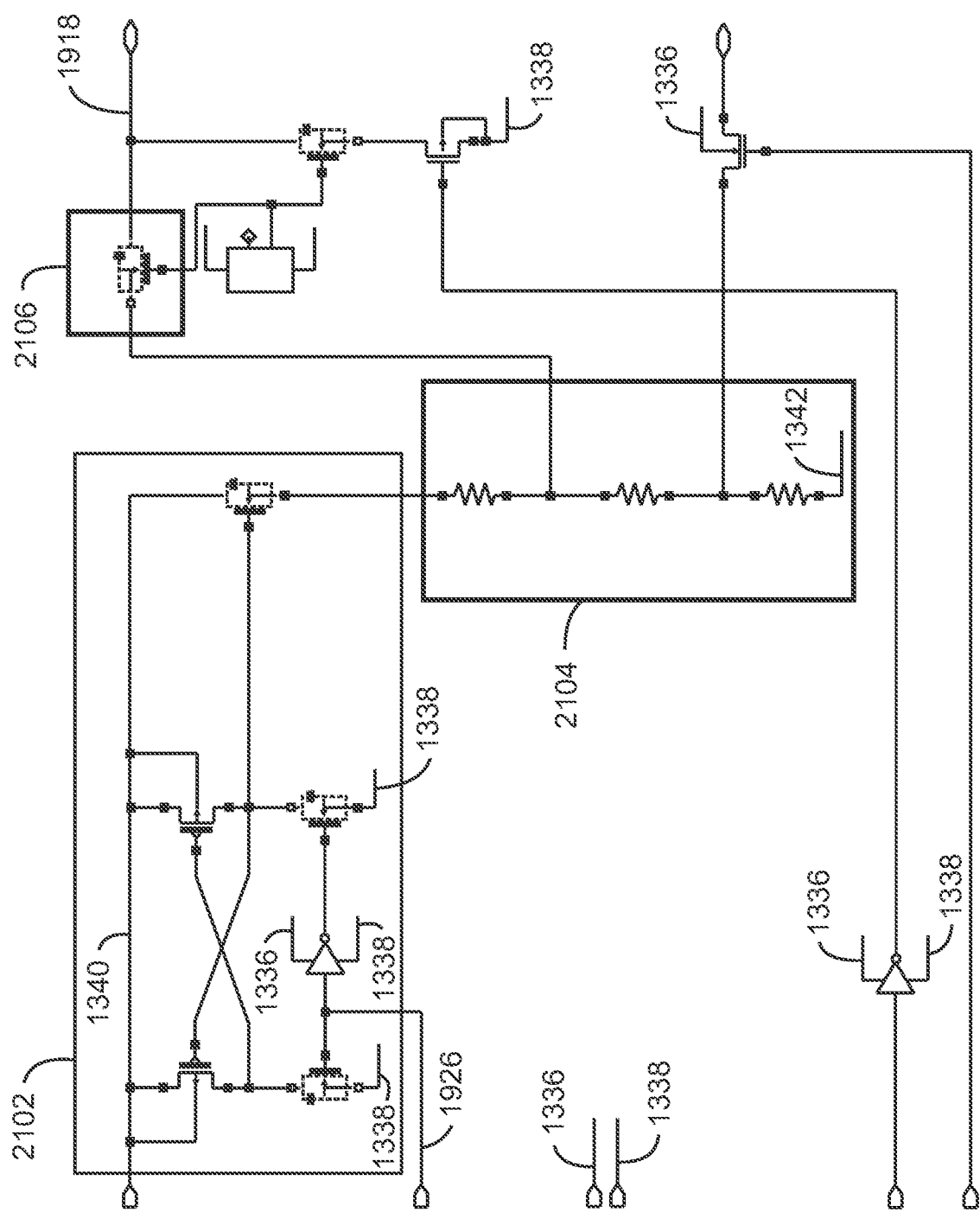
FIG. 21 is a circuit diagram of an example of a memory voltage regulator.

FIG. 21 is a circuit diagram of an example of a memory voltage regulator 1326. Like numbered items are as described with respect to FIGS. 13, 16, and 19. In this example, the memory voltage regulator 1326 includes three major sub circuits. A high-voltage level shifter 2102 uses an array of MOSFETs to translate a low-voltage control signal into a high-voltage output signal for use by the high-voltage resistor divider. A high-voltage resistor divider 2104 then divides the voltage to provide the 11 V output signal. The 11 V output signal flows through a high-voltage diode protection 2106 before being placed on the memory bus 1918, for example, during a write cycle.

Figure 22A:
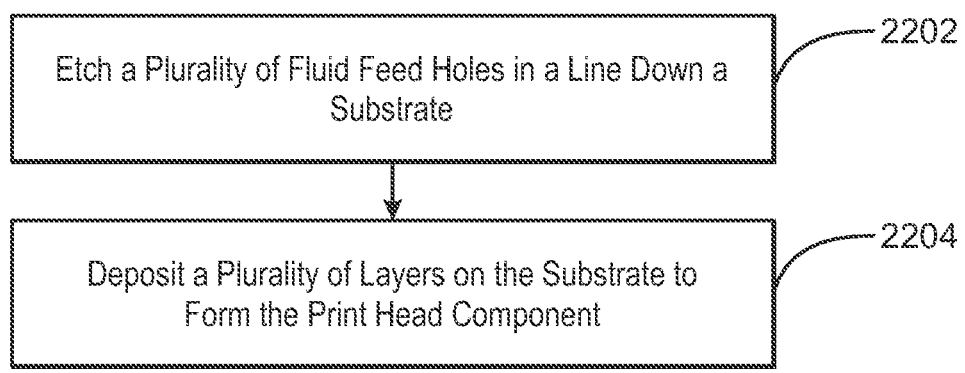
FIG. 22A is a process flow diagram of an example of a method for forming a printhead component.

FIG. 22A is a process flow diagram of an example of a method 2200 for forming a printhead component. The method 2200 may be used to make the color die 304 used as a printhead component for color printers, as well as the black die 302 used for black inks, and other types of dies that include fluidic actuators. The method 2200 begins at block 2202 with the etching of the fluid feed holes down the center of a silicon substrate. In some examples, layers are deposited first, then the etching of the fluid feed holes is performed after the layers are formed.

In an example, a layer of photoresist polymer, such as SU-8, is formed over a portion of the die to protect areas that are not to be etched. The photoresist may be a negative photoresist, which is cross-linked by light, or a positive photoresist, which is made more soluble by light exposure. In an example, a mask is exposed to a UV light source to fix portions of the protective layer, and portions not exposed to UV light are removed, for example, with a solvent wash. In this example, the mask prevents cross-linking of the portions of the protective layer covering the area of the fluid feed holes.

At block 2204, a plurality of layers is formed on the substrate to form the printhead component. The layers may include a polysilicon, a dielectric over the polysilicon, a first metal layer, a dielectric over the first metal layer, a second metal layer, a dielectric over the second metal layer, and a tantalum layer over the top. An SU-8 may then be layered over the top of the die and patterned to implement the flow channels and fluidic actuators. The formation of the layers may be formed by chemical vapor deposition to deposit the layers followed by etching to remove portions that are not needed. The fabrication techniques may be the standard fabrication used in forming complementary metal-oxide-semiconductors (CMOS). The layers that can be formed in block 2204 and the location of the components is discussed further with respect to FIG. 22B.

Figure 22B:
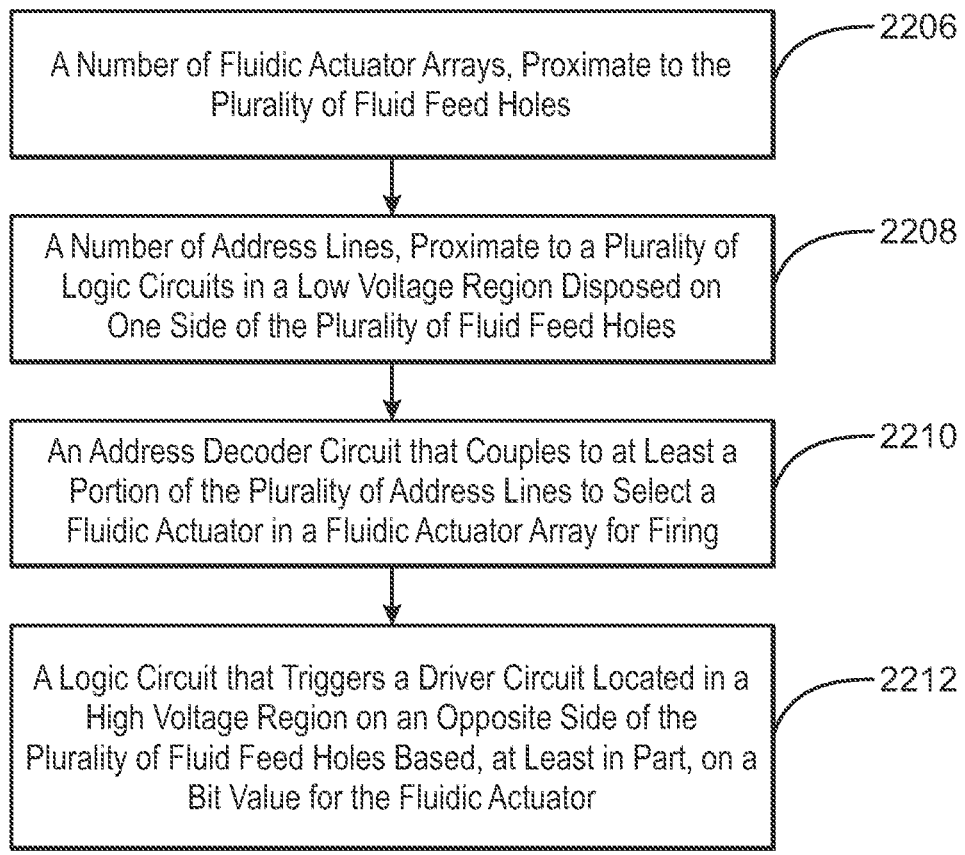
FIG. 22B is a process flow diagram of the components formed by the layers of block 2204 in the method.

FIG. 22B is a process flow diagram of the components formed by the layers of block 2204 in the method 2200. The method begins at block 2206 with forming a number of fluidic actuator arrays proximate to the fluid feed holes. At block 2208, a number of address lines are formed proximate to a number of logic circuits in a low-voltage region disposed on one side of the plurality of fluid feed holes. At block 2210, an address decoder circuit is formed on the die that couples to at least a portion of the address lines to select a fluidic actuator in a fluidic actuator array for firing. At block 2212, a logic circuit is formed on the die that triggers a driver circuit located in a high-voltage region on an opposite side of the fluid feed holes, based, at least in part, on a bit value associated with the fluidic actuator.

The blocks shown in FIG. 22B are not to be considered sequential. As would be clear to one of skill in the art, the various lines and circuits are formed across the die at the same time as the various layers are formed. Further, the processes described with respect to FIG. 22B may be used to form components on either a color die or a black-and-white die.

Figure 22C:
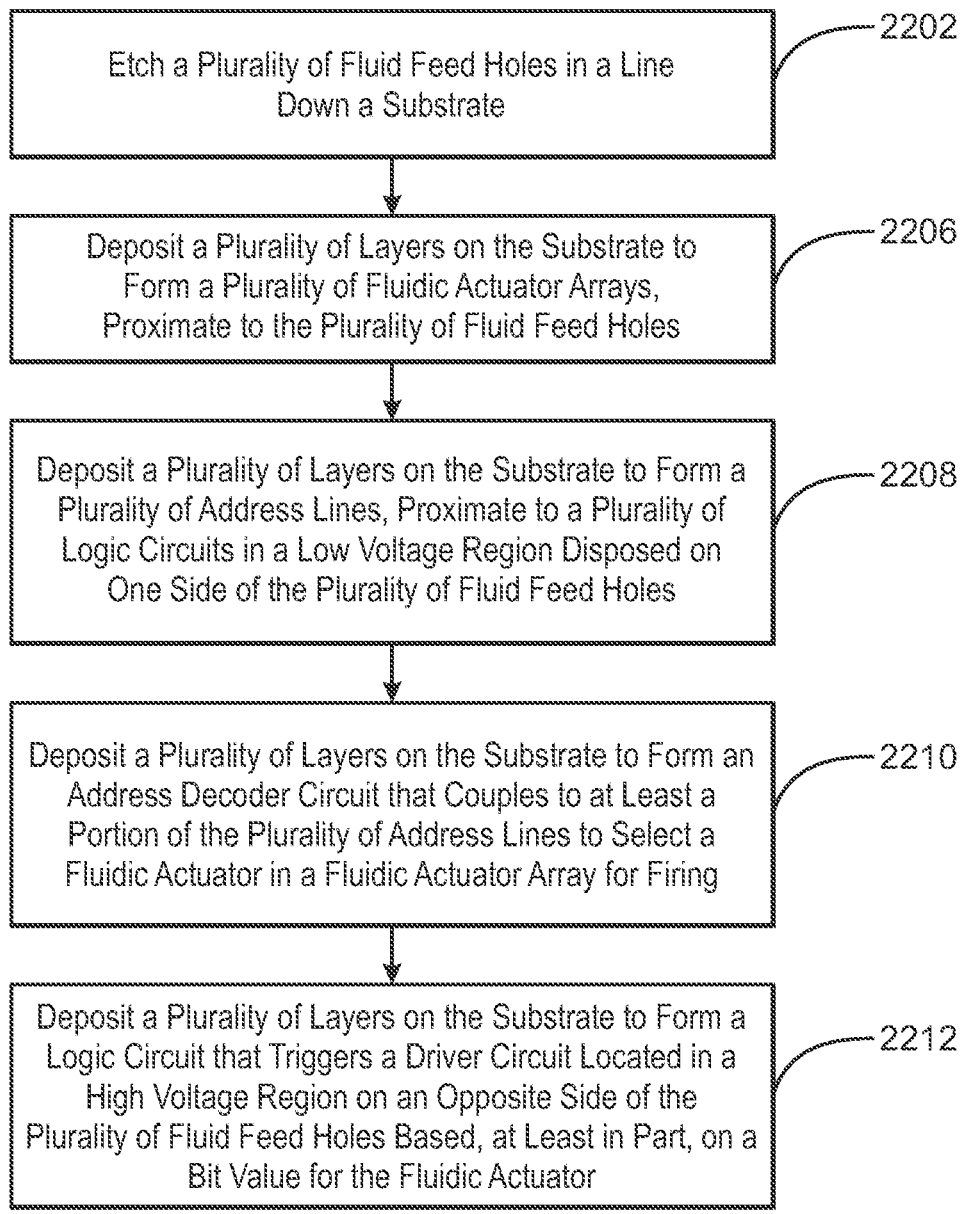
FIG. 22C is a process flow diagram of the combined method showing the layers and structures that are formed.

FIG. 22C is a process flow diagram of the combined method 2200 showing the layers and structures that are formed. Like numbered items are as described with respect to FIGS. 22A and 22B.

Figure 23:
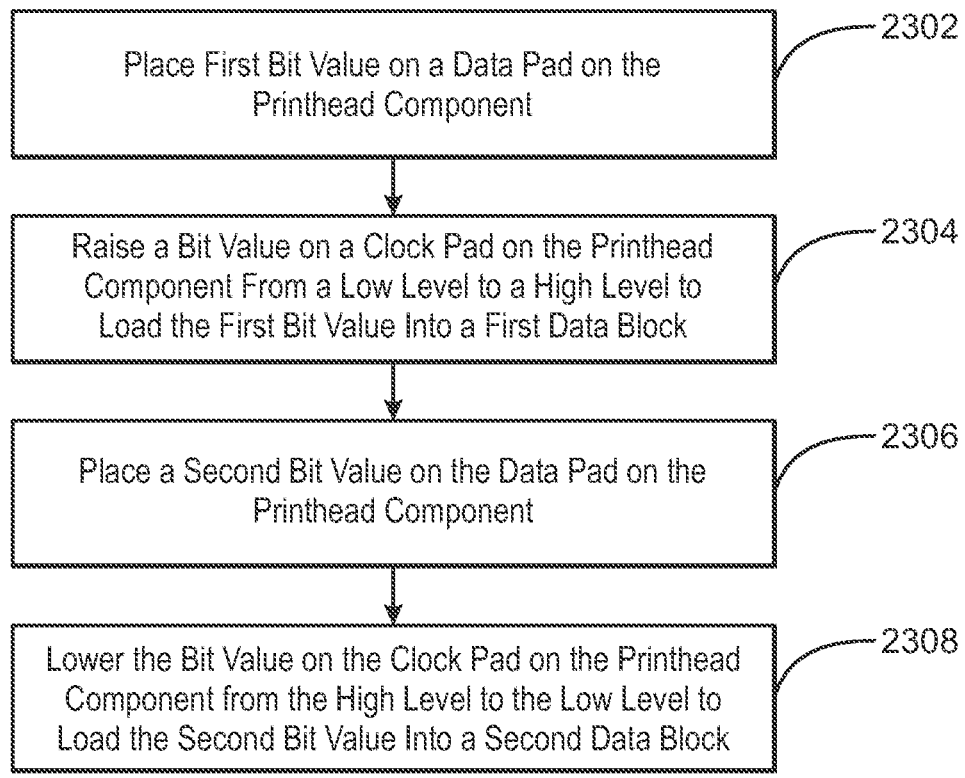
FIG. 23 is a process flow diagram of an example of a method for loading data into a printhead component.

FIG. 23 is a process flow diagram of an example of a method 2300 for loading data into a printhead component. The method 2300 begins at block 2302, when a bit value is placed on a data pad on the printhead component. At block 2304, a bit value on a clock pad on the printhead component is raised from a low level to a high level to load the bit value into a first data block. At block 2306, a second bit value is placed on the data pad on the printhead component. At block 2308 the bit value of the clock pad is lowered from the high level to the low level to load the second bit value into a second data block.

Figure 24:
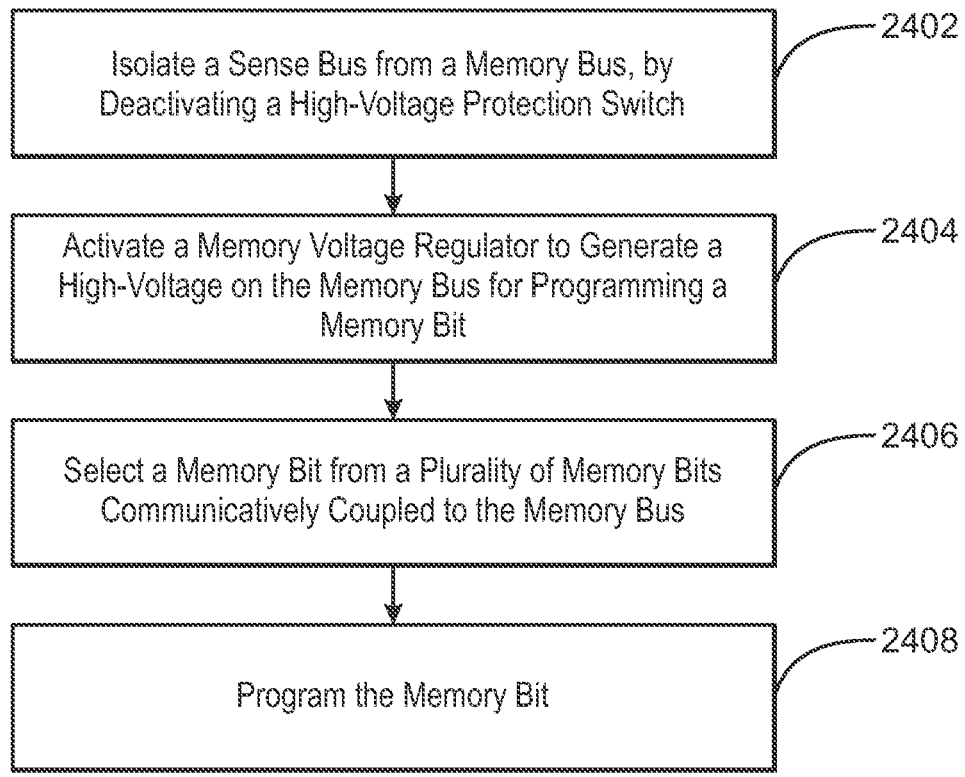
FIG. 24 is a process flow diagram of an example of a method for writing a memory bit in a printhead component.

FIG. 24 is a process flow diagram of an example of a method 2400 for writing a memory bit in a printhead component. At block 2402, a sense bus is isolated from a memory bus by deactivating a high-voltage protection switch. At block 2404, a memory voltage regulator is activated to generate a high-voltage on the memory bus for programming a memory bit. At block 2406, a memory bit is selected from a plurality of memory bits, communicatively coupled to the memory bus. At block 2408, the memory bit is programmed. The programming may take place for a preset period of time, such as about 0.1 milliseconds (mS), about 0.5 (mS), about 1 mS, or higher, for example, up to about 100 mS. The longer the programming time, the more strongly the memory bit will respond. After this preset period of time, the memory voltage regulator may be deactivated to end the programming sequence.

The present examples may be susceptible to various modifications and alternative forms and have been shown only for illustrative purposes. Furthermore, it is to be understood that the present techniques are not intended to be limited to the particular examples disclosed herein. Indeed, the scope of the appended claims is deemed to include all alternatives, modifications, and equivalents that are apparent to persons skilled in the art to which the disclosed subject matter pertains.

What is claimed is:

1. A die for a printhead, comprising:
   a configuration register;
   a memory configuration register to operate parallel to the configuration register;
   a plurality of fluidic actuator arrays;
   a power line and a separate activation signal line routed across a feed zone of the die;
   data blocks in a data store coupled to the memory configuration register, the data blocks comprising a data block associated with each of the plurality of fluidic actuator arrays; and
   an interface comprising a data pad and a clock pad, wherein the data blocks are configured so that a data bit value present at the data pad is loaded into a first data block corresponding to a first fluidic actuator array on a rising clock edge and loaded into a second data block corresponding to a second fluidic actuator array on a falling clock edge.

2. The die of claim 1, comprising address lines, wherein a plurality of address bits carried on the address lines selects which fluidic actuator in a fluidic actuator array is to be fired.

3. The die of claim 1, wherein the interface comprises a fire pad, wherein a fire bit value at the fire pad enables a fluidic actuator in a fluidic actuator array.

4. The die of claim 1, comprising a plurality of memory bits, wherein each of the plurality of memory bits shares an address with a data block for the first fluidic actuator array.

5. The die of claim 1, wherein the interface comprises a mode pad, wherein a mode bit value at the mode pad controls a memory access mode.

6. The die of claim 5, wherein the configuration register is written to when the mode bit value is high.

7. The die of claim 1, wherein the memory configuration register is written to when a stored bit value in the configuration register is high.

8. The die of claim 1, wherein the first fluidic actuator array is disposed along a first side of a plurality of fluid feed holes (IFHs) and the second fluidic actuator array is disposed along a second side of the plurality of the fluid feed holes, and wherein the second fluidic actuator array is disposed so that each fluidic actuator is positioned to print between a pair of fluidic actuators in the first fluidic actuator array.

9. The die of claim 1, wherein the first fluidic actuator array comprises a plurality of larger fluidic actuators and the second fluidic actuator array comprises a plurality of smaller fluidic actuators, wherein a larger fluidic actuator is disposed between a pair of smaller fluidic actuators in the second fluidic actuator array.

* * * * *